US012407269B2

(12) United States Patent
Kusukawa et al.

(10) Patent No.: US 12,407,269 B2
(45) Date of Patent: Sep. 2, 2025

(54) SEMICONDUCTOR DEVICE, BUSBAR, AND POWER CONVERTER

(71) Applicant: Hitachi Astemo, Ltd., Hitachinaka (JP)

(72) Inventors: Junpei Kusukawa, Tokyo (JP);
Masahito Mochizuki, Tokyo (JP);
Eiichi Ide, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 368 days.

(21) Appl. No.: 17/924,569

(22) PCT Filed: Jan. 22, 2021

(86) PCT No.: PCT/JP2021/002145
§ 371 (c)(1),
(2) Date: Nov. 10, 2022

(87) PCT Pub. No.: WO2021/229859
PCT Pub. Date: Nov. 18, 2021

(65) Prior Publication Data
US 2023/0231487 A1    Jul. 20, 2023

(30) Foreign Application Priority Data

May 13, 2020  (JP) ................................ 2020-084711

(51) Int. Cl.
*H02M 7/00*   (2006.01)
*H01L 23/00*  (2006.01)
(Continued)

(52) U.S. Cl.
CPC .......... *H02M 7/003* (2013.01); *H01L 23/049* (2013.01); *H01L 24/48* (2013.01); *H01L 25/072* (2013.01);
(Continued)

(58) Field of Classification Search
CPC ...... H02M 7/003; H01L 23/049; H01L 24/48; H01L 25/072; H01L 2224/48137; H01L 2924/13055; H01L 2924/30107
See application file for complete search history.

(56) References Cited

U.S. PATENT DOCUMENTS 5,386,342 A * 1/1995 Rostoker ............... H01L 23/564
                                                     257/668
6,560,115 B1 * 5/2003 Wakabayashi ....... H05K 5/0065
                                                     361/728
(Continued)

FOREIGN PATENT DOCUMENTS

JP    2007-299781 A    11/2007
JP    2015-149363 A     8/2015
(Continued)

OTHER PUBLICATIONS

International Search Report with English Translation and Written Opinion dated May 25, 2021 in corresponding International Application No. PCT/JP2021/002145.

*Primary Examiner* — Imani N Hayman
*Assistant Examiner* — Rashen E Morrison
(74) *Attorney, Agent, or Firm* — Foley & Lardner LLP

(57) ABSTRACT

Provided are a semiconductor device, a busbar, and a power converter that can suppress an increase in the size of the device and in inductance while ensuring insulation performance between terminals. For example, a semiconductor device 1 includes a first terminal 110 projecting from a sealing body 100 along a given direction, and a second terminal 120 adjacent to the first terminal 110 with a space formed between the second terminal 120 and the first terminal 110, the second terminal 120 projecting from the sealing body 100 along a given direction in a direction of projection that is the same as a direction of projection of the first terminal 110. The first terminal 110 has a first exposed (Continued)

part 112 exposed outside the sealing body 100. The second terminal 120 has a second sheathed part 121 projecting from the sealing body 100, the second sheathed part 121 being sheathed with an insulating material, and a second exposed part 122 projecting from the second sheathed part 121, the second exposed part 122 being exposed outside the sealing body 100. A distance D2 along a given direction from a front end 121a of the second sheathed part 121 to the sealing body 100 is longer than a distance D1 along the given direction from a front end 112a of the first exposed part 112 to the sealing body 100.

5 Claims, 14 Drawing Sheets

(51) Int. Cl.
H01L 23/049 (2006.01)
H01L 25/07 (2006.01)
(52) U.S. Cl.
CPC ............. H01L 2224/48137 (2013.01); H01L 2924/13055 (2013.01); H01L 2924/30107 (2013.01)

(56) References Cited

U.S. PATENT DOCUMENTS

| | | | |
|---|---|---|---|
| 11,029,722 B2* | 6/2021 | Lee | G06F 1/183 |
| 2002/0109237 A1* | 8/2002 | Oka | H01L 24/86 257/777 |
| 2002/0190374 A1* | 12/2002 | Nakajima | H01L 21/565 257/713 |
| 2004/0099933 A1* | 5/2004 | Kimura | H01L 23/4334 257/676 |
| 2007/0252169 A1 | 11/2007 | Tokuyama et al. | |
| 2008/0017882 A1* | 1/2008 | Nakanishi | H01L 24/40 257/E25.031 |
| 2008/0174458 A1* | 7/2008 | Mundt | G06F 1/1616 361/679.08 |
| 2009/0302722 A1* | 12/2009 | Mihara | G06F 1/1656 361/679.08 |
| 2010/0149741 A1* | 6/2010 | Liu | G06F 1/1613 361/679.08 |
| 2013/0105961 A1 | 5/2013 | Jones et al. | |
| 2013/0277087 A1* | 10/2013 | Hayakawa | H01B 3/30 174/107 |
| 2014/0167241 A1* | 6/2014 | Matsuoka | H01L 23/24 257/690 |
| 2015/0221621 A1 | 8/2015 | Mochida | |
| 2016/0176369 A1* | 6/2016 | Ito | H01B 9/006 174/72 A |
| 2017/0040241 A1* | 2/2017 | Yoshida | H01L 23/473 |
| 2019/0096784 A1* | 3/2019 | Katayama | H01L 23/3737 |
| 2020/0124352 A1* | 4/2020 | Wakaoka | F28D 15/0233 |
| 2020/0176435 A1 | 6/2020 | Fukushima et al. | |
| 2020/0262364 A1* | 8/2020 | Eshima | H02G 3/0406 |
| 2021/0391236 A1* | 12/2021 | Tsuyuno | H01L 23/49531 |
| 2022/0082421 A1* | 3/2022 | Ogata | G01F 15/14 |
| 2022/0165712 A1* | 5/2022 | Matsuoka | H01L 23/49562 |

FOREIGN PATENT DOCUMENTS

| | | |
|---|---|---|
| JP | 2016-134492 A | 7/2016 |
| JP | 2019-037048 A | 3/2019 |

* cited by examiner

SEMICONDUCTOR DEVICE, BUSBAR, AND POWER CONVERTER

TECHNICAL FIELD

The present invention relates to a semiconductor device, busbar, and a power converter.

BACKGROUND ART

As a technique for ensuring insulation performance between terminals projecting from a resin package in which a semiconductor element is sealed, for example, a technique described in Patent Literature 1 is known.

Patent Literature 1 describes a semiconductor device including a sealing part that seals a first lead terminal and a second lead terminal adjacent to each other, and a lead sheathed part with an insulation property that extends from an end of the sealing part and that sheathes an outer lead of the second lead terminal in such a way as to leave the front end of the outer lead exposed.

CITATION LIST

Patent Literature

PTL 1: Japanese Patent No. 6345608

SUMMARY OF INVENTION

Technical Problem

In the semiconductor device described in PTL 1, a creepage distance between the first lead terminal and the second lead terminal is secured by providing the second lead terminal with the lead sheathed part. In the semiconductor device described in Patent Literature 1, however, a space distance between the first lead terminal and the second lead terminal is secured by merely increasing a space between the first lead terminal and the second lead terminal. Increasing the space between the first lead terminal and the second lead terminal leads to an increase in the size of the device and in inductance. Such a problem may arise also in a busbar having terminals connected to terminals of the semiconductor device or a power converter in which the terminals of the semiconductor device are connected to the terminals of the busbar to make up a main circuit.

The present invention has been conceived in view of the above problem, and it is therefore an object of the invention to provide a semiconductor device, a busbar, and a power converter that can suppress an increase in the size of a device and in inductance while ensuring insulation performance between terminals.

Solution to Problem

In order to solve the above problem, a semiconductor device according to the present invention includes: a sealing body in which a semiconductor element is resin-sealed; a first terminal connected to the semiconductor element, the first terminal projecting from the sealing body along a given direction; and a second terminal connected to the semiconductor element, the second terminal being adjacent to the first terminal with a space formed between the second terminal and the first terminal and projecting from the sealing body along the given direction in a direction of projection that is the same as a direction of projection of the first terminal. The first terminal has a first exposed part that extends in the given direction and that is exposed outside the sealing body. The second terminal has a sheathed part projecting from the sealing body, the sheathed part extending in the given direction and being sheathed with an insulating material, and a second exposed part projecting from the sheathed part, the second exposed part extending in the given direction and being exposed outside the sealing body. A distance along the given direction from a front end of the sheathed part to the sealing body is longer than a distance along the given direction from a front end of the first exposed part to the sealing body.

Advantageous Effects of Invention

According to the present invention, an increase in the size of a device and in inductance can be suppressed as insulation performance between terminals is ensured.

Problems, configurations, and effects other than those described above will be made clear by the following description of embodiments.

DESCRIPTION OF EMBODIMENTS

Embodiments of the present invention will hereinafter be described with reference to the drawings. In each embodiment, constituent elements denoted by the same reference signs have the same functions unless otherwise specified, and therefore redundant description of such constituent elements is omitted. In addition, in drawings necessary for reference, orthogonal coordinate axes, i.e., an x-axis, a y-axis, and a z-axis are shown to make description of the positions of individual parts clear.

First Embodiment

Figure 1:
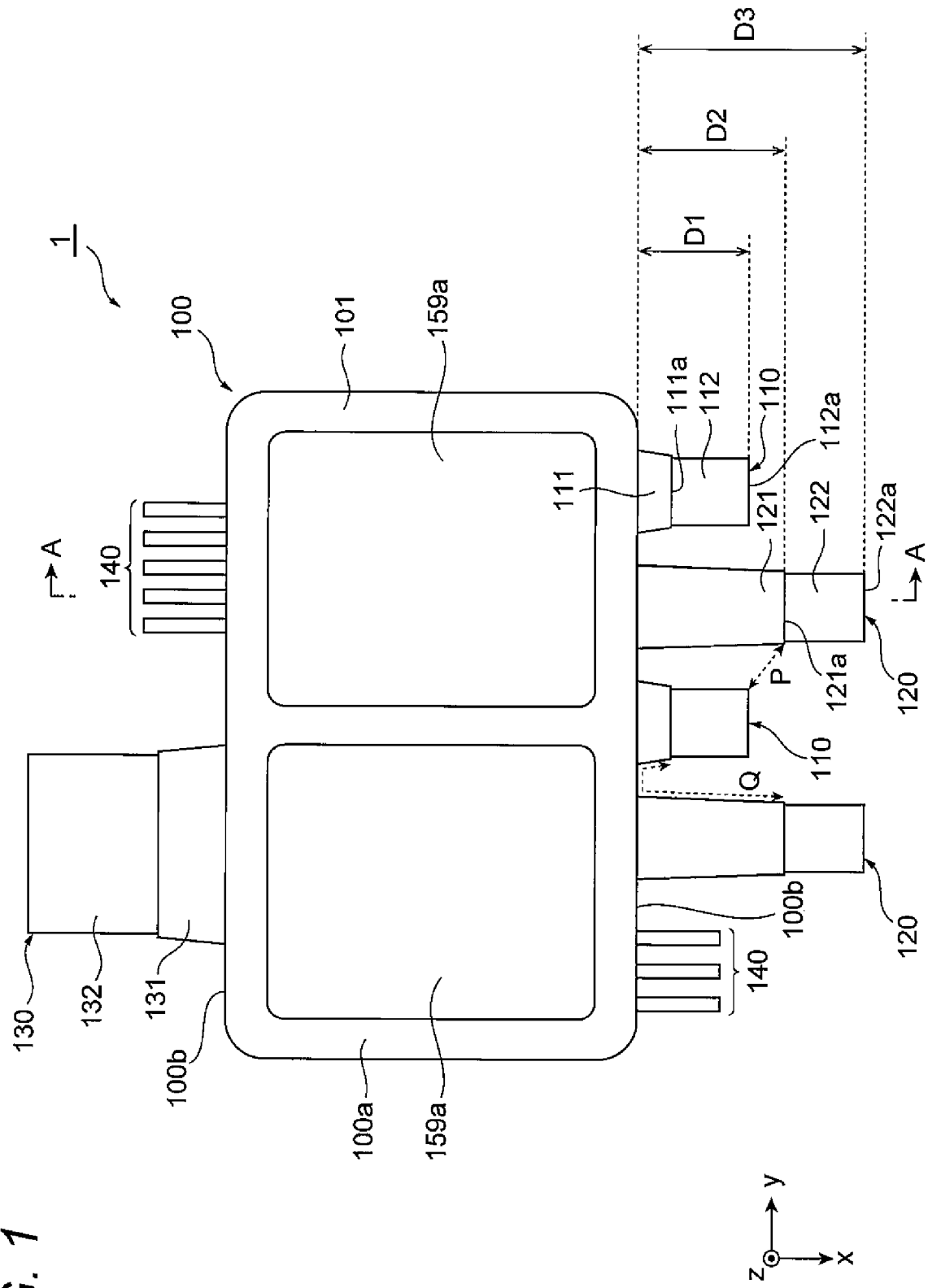
FIG. 1 is an external view of a semiconductor device according to a first embodiment.
Figure 2:
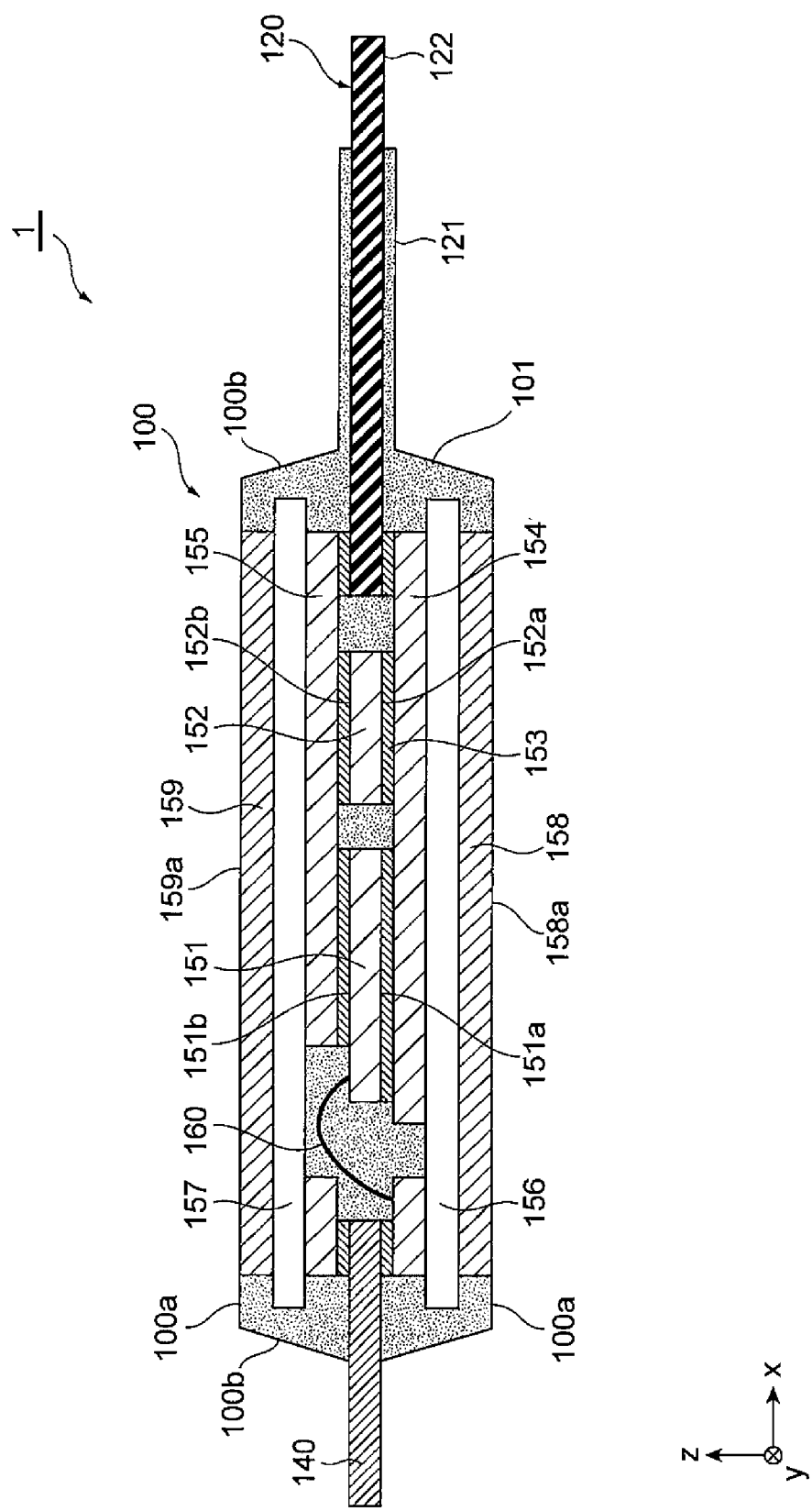
FIG. 2 is a cross-sectional view of the semiconductor device, the cross-sectional view being taken along a line A-A shown in FIG. 1.
Figure 3:
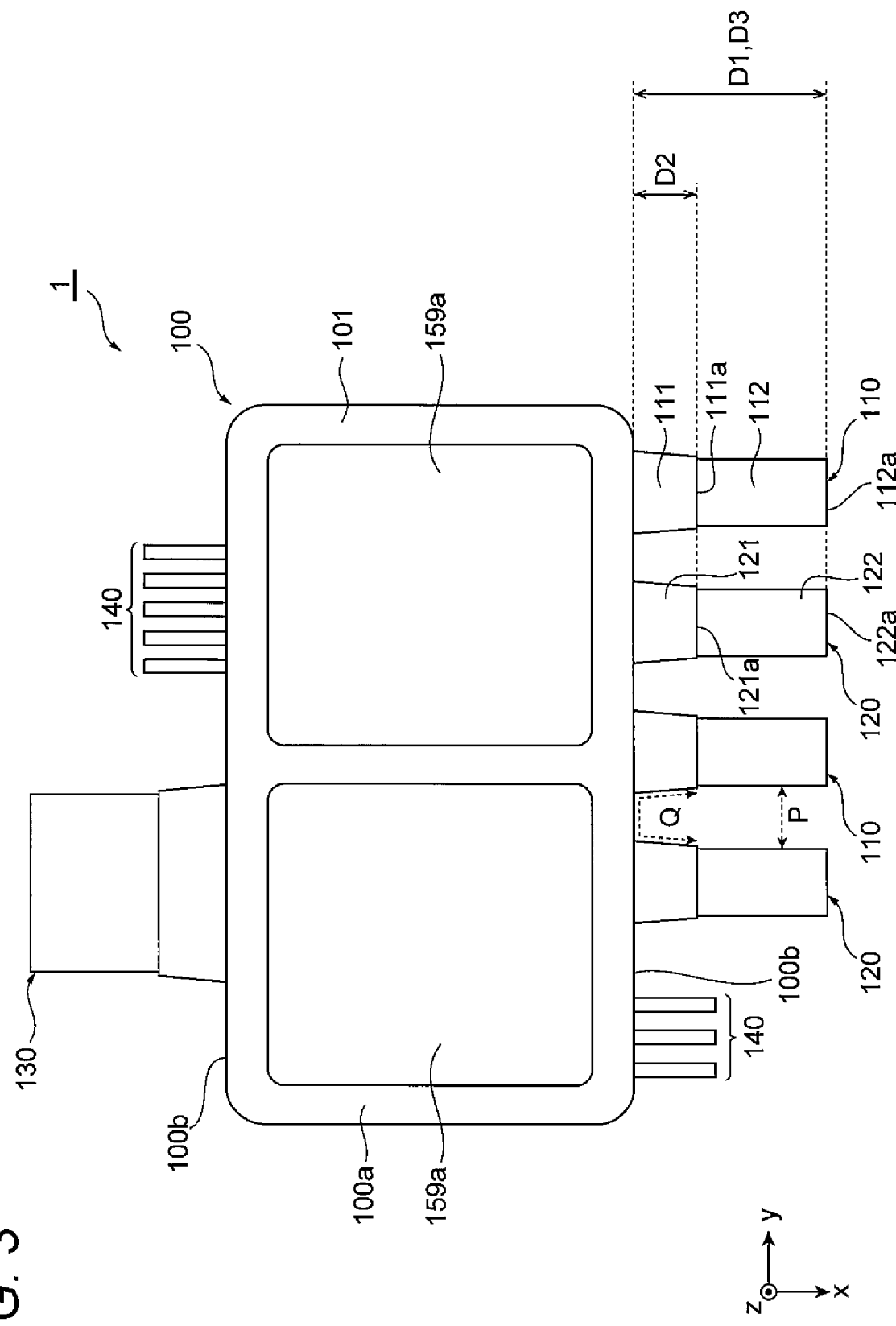
FIG. 3 depicts a comparative example of the semiconductor device shown in FIG. 1.

FIG. 1 is an external view of a semiconductor device 1 according to a first embodiment. FIG. 2 is a cross-sectional view of the semiconductor device 1, the cross-sectional view being taken along a line A-A shown in FIG. 1. FIG. 3 depicts a comparative example of the semiconductor device 1 shown in FIG. 1.

The semiconductor device 1 is a power semiconductor module used in a power converter 3, such as an inverter. The semiconductor device 1 is a power semiconductor module widely used in fields of consumer goods, in-vehicle equipment, railway equipment, industrial products, and infrastructure constructions. The semiconductor device 1 shown in FIG. 1 is, for example, a power semiconductor module incorporated in power-operated vehicles, such as hybrid vehicles, electric vehicles, and fuel cell vehicles. The semiconductor device 1 converts an input DC voltage from a battery, into a pseudo AC voltage by switching operations of a semiconductor element, and outputs the AC voltage. To the semiconductor device 1, a busbar 2 shown in FIG. 4, which will be described later, is connected (see FIG. 7). The semiconductor device 1 and the busbar 2, plus a capacitor module (not illustrated), make up a main circuit of the power converter 3.

As shown in FIG. 1, the semiconductor device 1 includes a sealing body 100, first terminals 110, second terminals 120, an output terminal 130, and control terminals 140.

The sealing body 100 is a structure in which components of the semiconductor device 1, such as a first semiconductor element 151, are resin-sealed. The sealing body 100 is a structure in which the components of the semiconductor device 1 are sealed by transfer molding or the like, using a resin material 101, such as epoxy resin. The sealing body 100 is formed into a rectangular plate shape having a given plate thickness. The sealing body 100 makes up a resin package of the semiconductor device 1.

As shown in FIG. 2, the sealing body 100 includes first semiconductor element 151, a second semiconductor element 152, a first circuit conductor 154, a second circuit conductor 155, a first insulating layer 156, a second insulating layer 157, a first heat-dissipating conductor 158, and second heat-dissipating conductor 159.

The first semiconductor element 151 is composed of a power semiconductor element, such as an insulated gate bipolar transistor (IGBT) or an injection enhanced gate transistor (IEGT). The second semiconductor element 152 is composed of a diode, such as a free wheeling diode (FWD). The semiconductor device 1 shown in FIG. 1 includes the first semiconductor element 151 and the second semiconductor element 152 that make up an upper arm circuit, and the first semiconductor element 151 and the second semiconductor element 152 that make up a lower arm circuit. The semiconductor device 1 shown in FIG. 1 is a 2-in-1 power module.

Each of the first semiconductor element 151 and the second semiconductor element 152 is of a rectangular chip shape. The first semiconductor element 151 has a pair of main surfaces 151a and 151b each having a large area and serving as an electrode surface. The second semiconductor element 152 has a pair of main surfaces 152a and 152b each having a large area and an electrode surface. One main surface 151a of the first semiconductor element 151 and one main surface 152a of the second semiconductor element 152 are bonded to the first circuit conductor 154 via a bonding material 153, such as solder. The other main surface 151b of the first semiconductor element 151 and the other main surface 152b of the second semiconductor element 152 are bonded to the second circuit conductor 155 via a bonding material 153.

The first circuit conductor 154 and the second circuit conductor 155 are made of a metal material with excellent electric conductivity and thermal conductivity, such as copper or aluminum, and are each formed into a plate shape. The first circuit conductor 154 and the second circuit conductor 155 each have a pattern of an electric circuit formed thereon by etching or the like. The first circuit conductor 154 and the second circuit conductor 155 are bonded to the first terminal 110, the second terminal 120, the output terminal 130, and the control terminal 140 via the bonding material 153. The first circuit conductor 154 is connected to a control electrode, which is formed on the other main surface 151b of the first semiconductor element 151, through a wire 160. The first circuit conductor 154 has a surface bonded to the first insulating layer 156, the surface being opposite to the other surface of first circuit conductor 154 that is bonded to the first semiconductor element 151 and the second semiconductor element 152. The second circuit conductor 155 has a surface bonded to the second insulating layer 157, the surface being opposite to the other surface of second circuit conductor 155 that is bonded to the first semiconductor element 151 and the second semiconductor element 152.

The first insulating layer 156 and the second insulating layer 157 are made of a ceramic material with excellent insulation, thermal conductivity, and toughness, such as silicon nitride or aluminum nitride, and are each formed into a plate shape. The first insulating layer 156 has a surface bonded to the first heat-dissipating conductor 158, the surface being opposite to the other surface of first insulating layer 156 that is bonded to the first circuit conductor 154. The second insulating layer 157 has a surface bonded to the second heat-dissipating conductor 159, the surface being opposite to the other surface of second insulating layer 157 that is bonded to the second circuit conductor 155.

The first heat-dissipating conductor 158 and the second heat-dissipating conductor 159 are made of a metal material with excellent thermal conductivity and strength, such as copper or aluminum, and are each formed into a plate shape. The first heat-dissipating conductor 158 is molded such that a surface 158a opposite to a surface bonded to the first insulating layer 156 is exposed from the resin material 101. The second heat-dissipation conductor 159 is molded such that a surface 159a opposite to a surface bonded to the second insulating layer 157 is exposed from the resin material 101. The surface 158a and the surface 159a are set parallel to each other. The surface 158a and the surface 159a make up most of a main surface 100a of the sealing body 100.

The first heat-dissipating conductor 158, the first insulating layer 156, and the first circuit conductor 154 may be configured as an insulating circuit board by bonded them together in advance by diffusion bonding or the like. The second heat-dissipating conductor 159, the second insulating layer 157, and the second circuit conductor 155 may be configured as an insulating circuit board by bonded them together in advance by diffusion bonding or the like.

Each of the first terminal 110 and the second terminal 120 is made of a metal material with excellent electric conductivity, such as copper or aluminum, and is formed into a flat rod shape. Each of the first terminal 110 and the second terminal 120 is connected to the first semiconductor element 151 and the second semiconductor element 152, via the first circuit conductor 154, the second circuit conductor 155, and the bonding material 153. Each of the first terminal 110 and the second terminal 120 may be any one of a DC positive terminal, a DC negative terminal, an AC output terminal, or a control terminal. This embodiment will be explained on the assumption that the first terminal 110 is a DC negative terminal, the second terminal 120 is a DC positive terminal, the output terminal 130 is an AC output terminal, and the control terminal 140 is a control terminal.

The first terminal 110 projects from the sealing body 100 along a given direction. The first terminal 110 projects from a side surface 100b perpendicular to a shortish side of the sealing body 100, along a main surface 100a of the sealing body 100. In the example of FIG. 1, a direction in which the first terminal 110 projects is a +x-axis direction. The first terminal 110 has a first sheathed part 111 projecting from the sealing body 100, the first sheathed part 111 extending in the given direction and being sheathed with an insulating material, and a first exposed part 112 projecting from the first sheathed part 111, the first exposed part 112 extending in the given direction and being exposed outside the sealing body 100. The insulating material forming the first sheathed part 111 may be the same material as the resin material 101, or may be a resin material different from the resin material 101. A base end of the first sheathed part 111 is equivalent to a base end of the first terminal 110, and is connected to the sealing body 100. A front end 111a of the first sheathed part 111 is connected to a base end of the first exposed part 112. A front end 112a of the first exposed part 112 is equivalent to a front end of the first terminal 110.

The second terminal 120 projects from the sealing body 100 along the given direction toward the same side to which the first terminal 110 projects. The second terminal 120 is adjacent to the first terminal 110 with a space formed between the second terminal 120 and the first terminal 110.

A direction along the space between the first terminal 110 and the second terminal 120 is a direction perpendicular to the given direction in which the first terminal 110 and the second terminal 120 project, and is a direction perpendicular to a direction along the main surface 100a of the sealing body 100. In the example of FIG. 1, the direction along the space between the first terminal 110 and the second terminal 120 is a y-axis direction. The second terminal 120 has a second sheathed part 121 projecting from the sealing body 100, the second sheathed part 121 extending in the given direction and being sheathed with an insulating material, and a second exposed part 122 projecting from the second sheathed part 121, the second exposed part 122 extending in the given direction and being exposed outside the sealing body 100.

The insulating material forming the second sheathed part 121 may be the same material as the resin material 101, or may be a resin material different from the resin material 101. A base end of the second sheathed part 121 is equivalent to a base end of the second terminal 120, and is connected to the sealing body 100. A front end 121a of the second sheathed part 121 is connected to a base end of the second exposed part 122. A front end 122a of the second exposed part 122 is equivalent to a front end of the second terminal 120. The second sheathed part 121 is an example of a "sheathed part" described in the claims.

In the semiconductor device 1, the first terminals 110 and the second terminals 120 are arranged alternately from one end to the other end of the direction along the space between the first terminal 110 and the second terminal 120. In the example of FIG. 1, two sets of the first terminals 110 and the second terminals 120 are arranged alternately along a −y axis direction. Specifically, in the example of FIG. 1, the first terminal 110 of the first set, the second terminal 120 of the first set, the first terminal 110 of the second set, and the second terminal 120 of the second set are arranged in this order along the −y axis direction.

The output terminal 130 projects from a side surface 100b opposite to the side surface 100b of sealing body 100 that is provided with the first terminal 110 and the second terminal 120, along the main surface 100a of the sealing body 100 in the direction of projection that is opposite to the direction of projection of the first terminal 110 and the second terminal 120. The output terminal 130 has a third sheathed part 131 projecting from the sealing body 100, the third sheathed part 131 extending in the given direction and being sheathed with an insulating material, and a third exposed part 132 projecting from the third sheathed part 131, the third exposed part 132 extending in the given direction and being exposed outside the sealing body 100. The insulating material forming the third sheathed part 131 may be the same material as the resin material 101, or may be a resin material different from the resin material 101.

The control terminal 140 is disposed on the side surface 100b of sealing body 100 that is provided with the first terminal 110 and the second terminal 120 and on the side surface 100b of sealing body 100 that is provided with the output terminal 130. Specifically, one control terminal 140 projects from the side surface 100b of sealing body 100 that is provided with the first terminal 110 and the second terminal 120, along the main surface 100a of the sealing body 100 in the direction of projection that is the same as the direction of projection of the first terminal 110 and the second terminal 120. The one control terminal 140 is adjacent to the second terminal 120 with a space formed between the one control terminal 140 and the second terminal 120. The length of projection of the one control terminal 140 from the sealing body 100 is shorter than the length of projection of the second sheathed part 121 of the second terminal 120 from the sealing body 100. The other control terminal 140 projects from the side surface 100b of sealing body 100 that is provided with the output terminal 130, along the main surface 100a of the sealing body 100 in the direction of projection that is opposite to the direction of projection of the first terminal 110 and the second terminal 120. The other control terminal 140 is adjacent to the output terminal 130 with a space formed between the other control terminal 140 and the output terminal 130.

It is required, by the way, that the power converter 3 including the semiconductor device 1 and the busbar 2 increase power it can be handle. One conceivable method of increasing power that the power converter 3 can handle is to increase current flowing through the power converter 3. Increasing current, however, increases an amount of heat generated by the power converter 3. To reduce the amount of heat generated by the power converter 3, a conductor volume in a current path may be increased. In such a case, however, the weight and volume of the power converter 3 increase, which is a problem. In particular, in a case where the power converter 3 is used in an electric vehicle, an increase in the weight and volume of the power converter 3 results in a drop in the traveling performance and electric consumption performance of the vehicle. As a method of increasing power that the power converter 3 can handle, increasing a voltage the power converter 3 can handle is found effective. For example, the power converter 3 incorporated in hybrid vehicles or electric vehicles currently in popular use can handle voltages ranging roughly from 200

V to 400 V. In near future, the power converter 3 is expected to become capable of handling voltages in a higher range of 600 V to 800 V. The power converter 3 capable of handling higher voltages allows handling of larger power without increasing the conductor volume, and is therefore an effective approach. This offers an additional advantage in reducing a time required for charging the battery of an electric vehicle. If a voltage that can be handled in ordinary quick charging facilities, which is currently 400 V, is increased to 800 V, a charging time would be the half of a charging time in the case of charging with 400 V, proving that a charge volume is the same.

As described above, increasing voltage the power converter 3 handles is effective as a method of increasing power the power converter 3 handle. In this case, however, the power converter 3 needs to ensure its insulation performance that can deal with handling of higher voltage. One method of allowing the power converter 3 to ensure its insulation performance that can deal with handling of higher voltage is to secure an insulation distance. Such equipment as the semiconductor device 1, the busbar 2, and the power converter 3 need to meet requirements for a space distance P and a creepage distance Q that are defined by International Standard IEC 60664-1 (JIS C 60664-1 in Japanese Industrial Standards), as an insulation distance equipment needs. This standard defines the necessary space distance P and creepage distance Q, according to a voltage the semiconductor device 1 or the like handles or an environment (contamination level, etc.) under which the semiconductor device 1 or the like is used. The space distance P refers to a minimum distance in a space between two conductive parts. The creepage distance Q refers to a minimum distance along the surface of an insulating material between two conductive parts. As the space distance P and the creepage distance Q increase, an electrical short circuit (dielectric breakdown) between the two conductive parts is less likely to occur. As a result, ensuring the insulation performance of the equipment becomes easier and therefore ensuring the reliability of the equipment becomes easier as well.

Now, as shown in FIGS. 1 and 3, a distance along the given direction from the front end 112a of the first exposed part 112 of the first terminal 110 to the sealing body 100 is defined as a distance D1. A distance along the given direction from the front end 121a of the second sheathed part 121 of the second terminal 120 to the sealing body 100 is defined as a distance D2. A distance along the given direction from the front end 122a of the second exposed part 122 of the second terminal 120 to the sealing body 100 is defined as a distance D3. In the examples of FIGS. 1 and 3, the distance D1 is equivalent to the length of projection of the first terminal 110 from the sealing body 100. The distance D2 is equivalent to the length of projection of the second sheathed part 121 of the second terminal 120 from the sealing body 100. The distance D3 is equivalent to the length of projection of the second terminal 120 from the sealing body 100.

In the comparative example shown in FIG. 3, the length of projection of the second terminal 120 from the sealing body 100 is equal to the length of projection of the first terminal 110 from the sealing body 100. In addition, the length of projection of the second sheathed part 121 of the second terminal 120 from the sealing body 100 is equal to the length of projection of the first sheathed part 111 of the first terminal 110 from the sealing body 100. As a matter of course, the length of projection of the second exposed part 122 of the second terminal 120 from the sealing body 100 is equal to the length of projection of the first exposed part 112 of the first terminal 110 from the sealing body 100. In other words, in the comparative example shown in FIG. 3, the distance D3 and the distance D1 are equal, and the distance D2 is shorter than the distance D1.

In the comparative example shown in FIG. 3, the space distance P between the first terminal 110 and the second terminal 120 is the distance between the first exposed part 112 of the first terminal 110 and the second exposed part 122 of the second terminal 120. The creepage distance Q between the first terminal 110 and the second terminal 120 is the distance to travel through a path starting from the front end 111a of the first sheathed part 111 and extending along respective surfaces of the base end of the first sheathed part 111, the sealing body 100, and the base end of the second sheathed part 121 to reach the front end 121a of the second sheathed part 121. In the comparative example shown in FIG. 3, a direction in which the space distance P between the first terminal 110 and the second terminal 120 extends is parallel to a direction along the space between the first terminal 110 and the second terminal 120 (y-axis direction). In the creepage distance Q between the first terminal 110 and the second terminal 120, a part of creepage distance Q that extends along the surface of the second sheathed part 121 of the second terminal 120 and a part of creepage distance Q that extends along the surface of the first sheathed part 111 of the first terminal 110 may match in length.

In contrast, in the semiconductor device 1 shown in FIG. 1, the distance D2 is made longer than the distance D1. In other words, according to the semiconductor device 1 shown in FIG. 1, in the direction along the space between the first terminal 110 and the second terminal 120, the second sheathed part 121 is disposed on the second terminal 120 adjacent to the first exposed part 112 of the first terminal 110. In the semiconductor device 1 shown in FIG. 1, the distance D3 is made longer than the distance D1 so that the distance D2 is longer than the distance D1. Specifically, in the semiconductor device 1 shown in FIG. 1, the length of projection of the second sheathed part 121 of the second terminal 120 from the sealing body 100 is longer than the length of projection of the first exposed part 112 of the first terminal 110 from the sealing body 100. As a matter of course, the length of projection of the second terminal 120 from the sealing body 100 is longer than the length of projection of the first terminal 110 from the sealing body 100.

In the semiconductor device 1 shown in FIG. 1, the space distance P between the first terminal 110 and the second terminal 120 is the distance between the front end 112a of the first exposed part 112 of the first terminal 110 and the base end of the second exposed part 122, which is connected to the front end 121a of the second sheathed part 121 of the second terminal 120. The creepage distance Q between the first terminal 110 and the second terminal 120 is the distance to travel through a path starting from the front end 111a of the first sheathed part 111 of the first terminal 110 and extending along respective surfaces of the base end of the first sheathed part 111, the sealing body 100, and the base end of the second sheathed part 121 of the second terminal 120 to reach the front end 121a of the second sheathed part 121. In the semiconductor device 1 shown in FIG. 1, because the distance D2 is longer than the distance D1, the direction of the space distance P may be tilted against the direction along the space between the first terminal 110 and the second terminal 120 (y-axis direction). In the semiconductor device 1 shown in FIG. 1, therefore, even if the space between the first terminal 110 and the second terminal 120 is shorter than the space between the same in the comparative example shown in FIG. 3, the necessary space distance P can be secured. In the semiconductor device 1 shown in FIG. 1, because the distance D2 is longer than the distance D1, the part of creepage distance Q that extends along the surface of the second sheathed part 121 of the second terminal 120, the part making up the creepage distance Q between the first terminal 110 and the second terminal 120, may be longer than the part of creepage distance Q that extends along the same in the comparative example shown in FIG. 3. In the semiconductor device 1 shown in FIG. 1, therefore, even if the space between the first terminal 110 and the second terminal 120 is shorter than the space between the same in the comparative example shown in FIG. 3, the necessary creepage distance Q can be secured.

According to the semiconductor device 1 of the first embodiment, because the distance D2 is longer than the distance D1, the space between the first terminal 110 and the second terminal 120 can be shortened as the necessary space distance P and creepage distance Q are secured. In the semiconductor device 1, dimensions in the direction along the space between the first terminal 110 and the second terminal 120 can be reduced, which allows a reduction in the size of the semiconductor device 1. Reducing the size of the semiconductor device 1 allows a reduction in the size of the busbar 2 connected to the semiconductor device 1, thus allowing a reduction in the size of the power converter 3 constructed by connecting the semiconductor device 1 to the busbar 2.

According to the semiconductor device 1 of the first embodiment, because the distance D2 is longer than the distance D1, the second sheathed part 121 is disposed on the second terminal 120 adjacent to the first exposed part 112 of the first terminal 110, in the direction along the space between the first terminal 110 and the second terminal 120. This means that according to the semiconductor device 1, on a portion where a shortest distance is formed between the first terminal 110 and the second terminal 120 adjacent to each other, the sheathed part sheathed with the insulating material is disposed. When overvoltage is generated between the first terminal 110 and the second terminal 120 as a result of turn-on/off operations or the like, therefore, the semiconductor device 1 can suppress the occurrence of an electrical short circuit (dielectric breakdown) between the first terminal 110 and the second terminal 120. The semiconductor device 1 is thus able to improve its insulation performance and reliability. Because the reliability of the semiconductor device 1 is improved, the reliability of the power converter 3 constructed by connecting the semiconductor device 1 to the busbar 2 can be improved, too.

Furthermore, according to the semiconductor device 1 of the first embodiment, by shortening the space between the first terminal 110 serving as the DC negative terminal and the second terminal 120 serving as the DC positive terminal, a mutual inductance between the first terminal 110 serving as the DC negative terminal and the second terminal 120 serving as the DC positive terminal can be increased. As a result, the semiconductor device 1 can reduce an overall combined inductance between the semiconductor device 1 and the busbar 2, which make up the power converter 3, thus being able to reduce overvoltage and noise resulting from turn on/off operations or the like.

In the semiconductor device 1, when the distance D2 is longer than the distance D1, the space between the first terminal 110 and the second terminal 120 can be shortened as the necessary insulation distance is secured. In this case, the first terminal 110 having the first sheathed part 111 is not a prerequisite. However, in the semiconductor device 1, the first terminal 110 having the first sheathed part 111 makes securing the necessary creepage distance Q easier than in a case of the first terminal 110 not having the first sheathed part 111, and therefore allows a further shortening of the space between the first terminal 110 and the second terminal 120. The first terminal 110 having the first sheathed part 111 thus allows a reduction in the size of the device, an improvement in the insulation performance and the reliability, and a reduction in the combined inductance, and is therefore preferable.

In the above embodiment, the case where the first terminal 110 serves as the DC negative terminal and the second terminal 120 serves as the DC positive terminal has been described. In the semiconductor device 1, the first terminal 110 may serve as the DC positive terminal and the second terminal 120 may serve as the DC negative terminal, which case offers the same effect as offered by the above embodiment.

Figure 4:
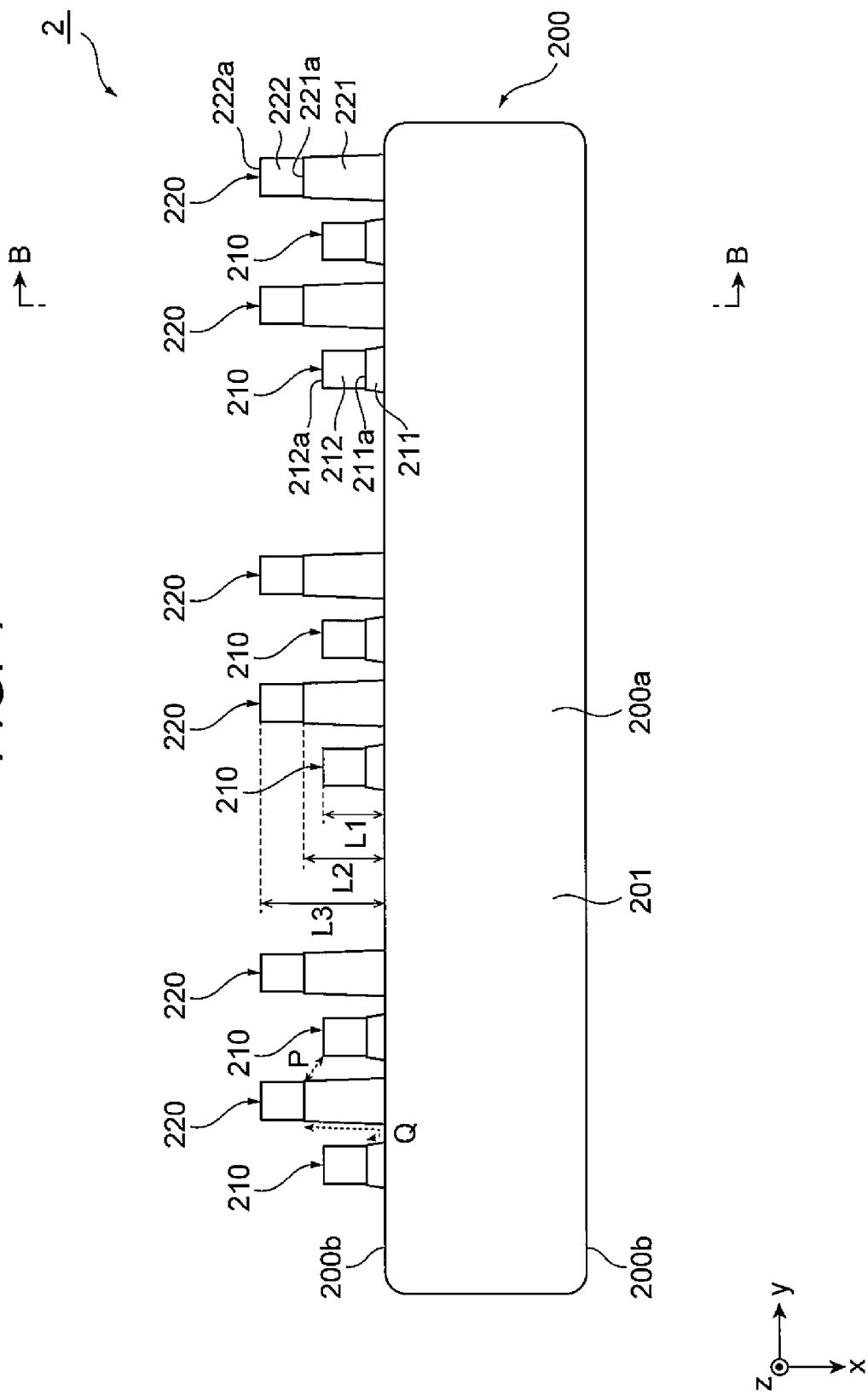
FIG. 4 is an external view of a busbar according to the first embodiment.
Figure 5:
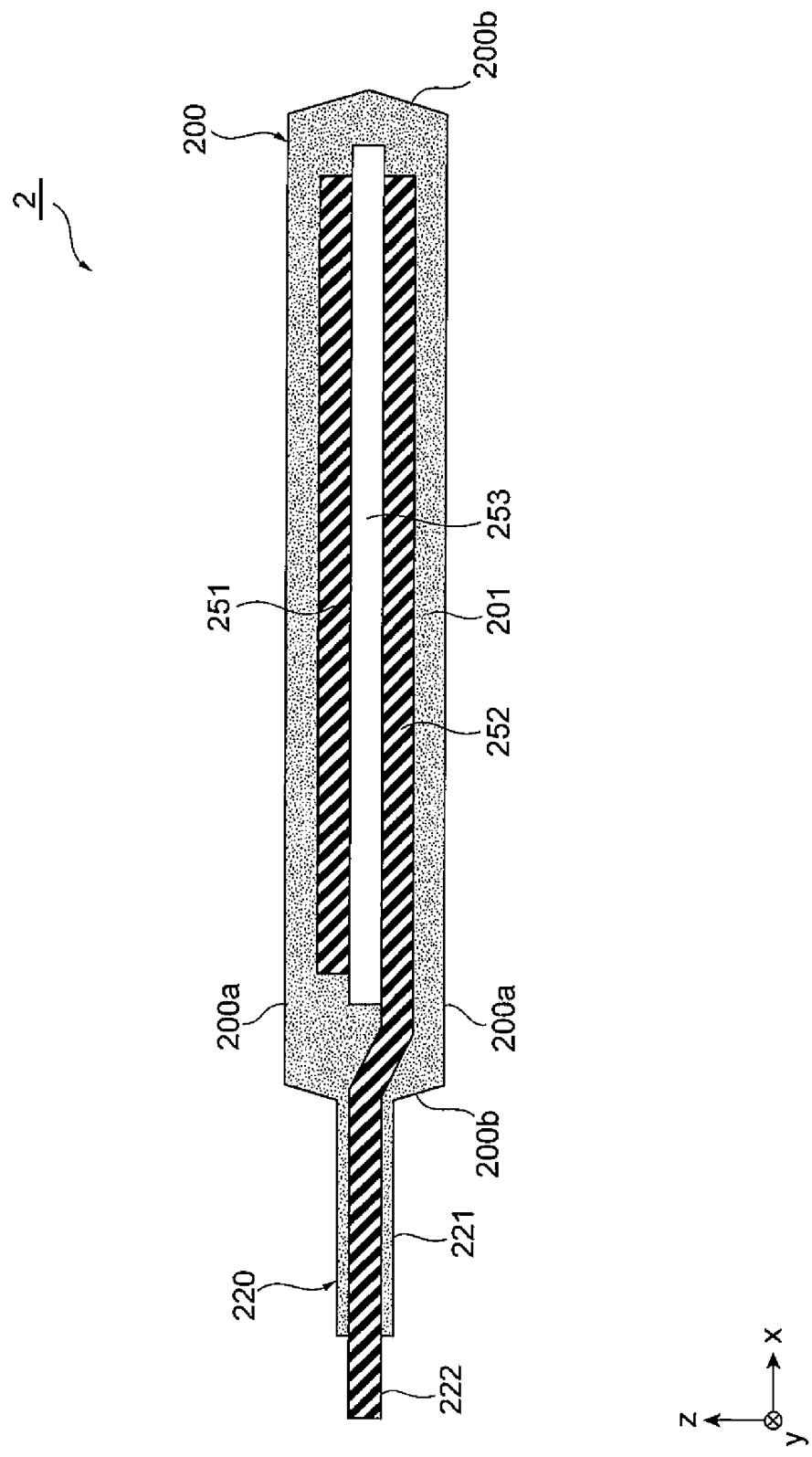
FIG. 5 is a cross-sectional view of the busbar, the cross-sectional view being taken along a line B-B shown in FIG. 4.
Figure 6:
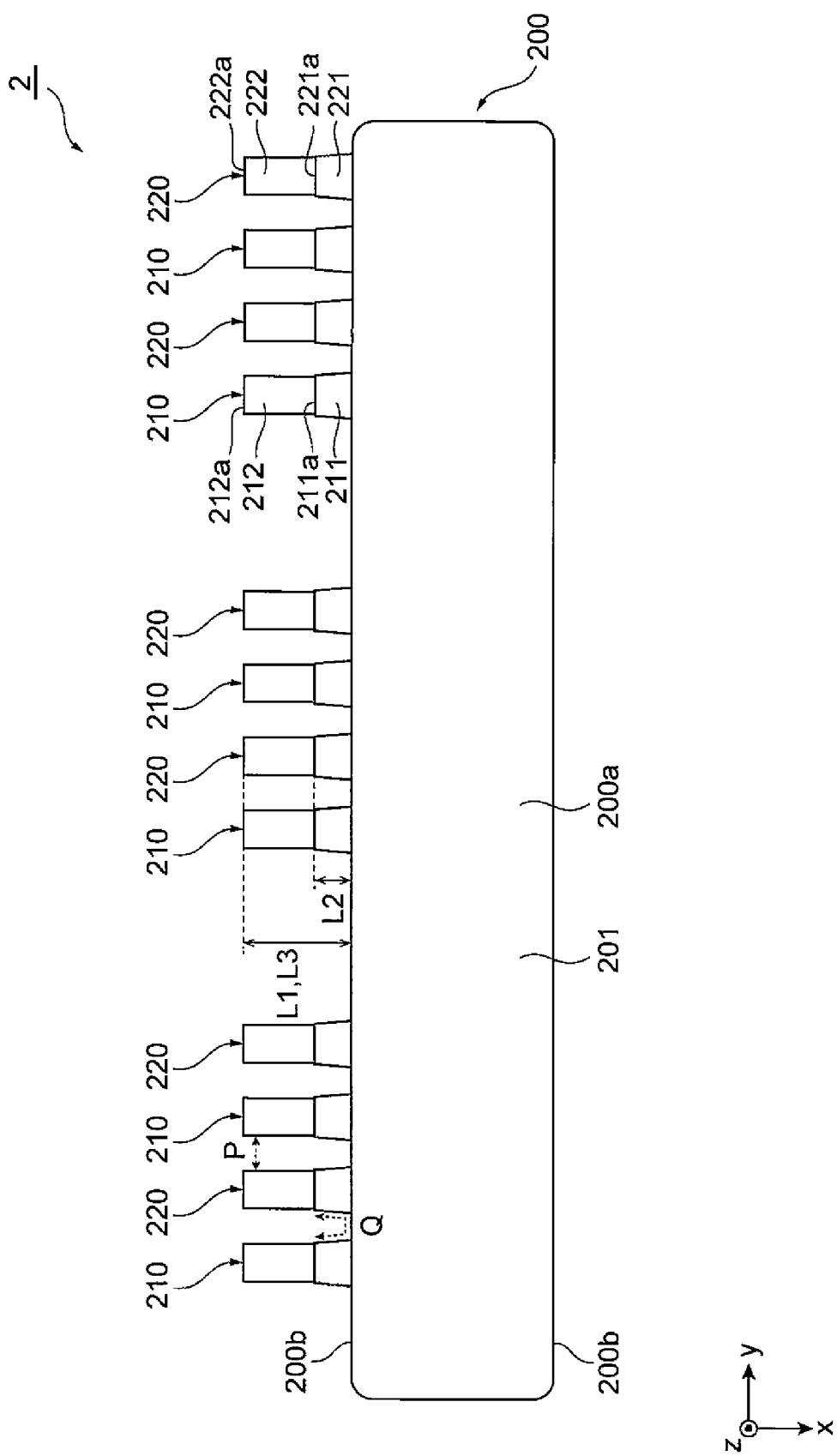
FIG. 6 depicts a comparative example of the busbar shown in FIG. 4.

FIG. 4 is an external view of the busbar 2 according to the first embodiment. FIG. 5 is a cross-sectional view of the busbar 2, the cross-sectional view being taken along a line B-B shown in FIG. 4. FIG. 6 depicts a comparative example of the busbar 2 shown in FIG. 4.

The busbar 2 is connected to the semiconductor device 1, and makes up the main circuit of the power converter 3. The busbar 2 is connected to the first terminal 110 and the second terminal 120 of the semiconductor device 1. The busbar 2 is connected to respective first terminals 110 and second terminals 120 of a plurality of semiconductor devices 1.

The busbar 2 shown in FIG. 4 is the busbar 2 that connects three semiconductor devices 1, which are 2-in-1 power modules, in parallel.

As shown in FIG. 4, the busbar 2 includes a molded body 200, busbar first terminals 210, and busbar second terminals 220.

The molded body 200 is a structure formed by molding components of the busbar 2 by a resin-molding method, such as injection molding using a resin material 201, which is poly phenylene sulfide (PPS) resin or the like. The molded body 200 is formed into a rectangular plate shape with a given thickness. As shown in FIG. 5, the molded body 200 includes a first conductor plate 251, a second conductor plate 252, and an insulating layer 253.

The first conductor plate 251 and the second conductor plate 252 are made of a metal material with excellent electric conductivity and thermal conductivity, such as copper or aluminum, and are each formed into a plate shape. The first conductor plate 251 and the second conductor plate 252 are connected to the busbar first terminal 210 and the busbar second terminal 220, respectively. The insulating layer 253 is made of a resin material with excellent insulation properties, such as PPS resin, and is formed into a plate shape. The first conductor plate 251 and the second conductor plate 252 are disposed counter to each other across the insulating layer 253 interposed therebetween. The second conductor plate 252, the insulating layer 253, and the first conductor plate 251 are stacked in this order, and are resin-molded, using the resin material 201. In the molded body 200 shown in FIG. 4, the first conductor plate 251, the second conductor plate 252, and the insulating layer 253 are sealed with the resin material 201. A main surface 200*a* of the molded body 200 is a surface along the first conductor plate 251 and the second conductor plate 252.

The busbar first terminal 210 and the busbar second terminal 220 are made of a metal material with excellent electric conductivity, such as copper or aluminum, and are each formed into a flat rod shape. The busbar first terminal 210 is connected to the second terminal 120 of the semiconductor device 1. The busbar second terminal 220 is connected to the first terminal 110 of the semiconductor device 1.

The busbar first terminal 210 project from the molded body 200 along a specific direction. The busbar first terminal 210 projects from a side surface 200b perpendicular to a shortish side of the molded body 200, along the main surface 200a of the molded body 200. In the example of FIG. 4, the direction of projection of the busbar first terminal 210 is an −x-axis direction. The busbar first terminal 210 includes a busbar first sheathed part 211 projecting from the molded body 200, the busbar first sheathed part 211 extending in a specific direction and being sheathed with a sheathing material having an insulation property, and a busbar first exposed part 212 projecting from the busbar first sheathed part 211, the busbar first exposed part 212 extending in the specific direction and being exposed outside the molded body 200. The sheathing material forming the busbar first sheathed part 211 may be the same material as the resin material 201, or may be a resin material different from the resin material 201. A base end of the busbar first sheathed part 211 is equivalent to a base end of the busbar first terminal 210, and is connected to the molded body 200. A front end 211a of the busbar first sheathed part 211 is connected to a base end of the busbar first exposed part 212. A front end 212a of the busbar first exposed part 212 is equivalent to a front end of the busbar first terminal 210.

The busbar second terminal 220 projects from the molded body 200 along the specific direction in the direction of projection that is the same as the direction of projection of the busbar first terminal 210. The busbar second terminal 220 is adjacent to the busbar first terminal 210 with a space formed between the busbar second terminal 220 and the busbar first terminal 210. A direction along the space between the busbar first terminal 210 and the busbar second terminal 220 is a direction perpendicular to the specific direction in which the busbar first terminal 210 and the busbar second terminal 220 project, and is a direction perpendicular to a direction along the main surface 200a of the molded body 200. In the example of FIG. 4, the direction along the space between the busbar first terminal 210 and the busbar second terminal 220 is the y-axis direction. The direction along the space between the busbar first terminal 210 and the busbar second terminal 220 is parallel to the direction along the space between the first terminal 110 and the second terminal 120 of the semiconductor device 1. The busbar second terminal 220 has a busbar second sheathed part 221 projecting from the molded body 200, the busbar second sheathed part 221 extending in the specific direction and being sheathed with a sheathing material with an insulation property, and a busbar second exposed part 222 projecting from the second sheathed part 221, the busbar second exposed part 222 extending in the specific direction and being exposed outside the molded body 200. The sheathing material forming the busbar second sheathed part 221 may be the same material as the resin material 201, or may be a resin material different from the resin material 201. A base end of the busbar second sheathed part 221 is equivalent to a base end of the busbar second terminal 220, and is connected to the molded body 200. A front end 221a of the busbar second sheathed part 221 is connected to a base end of the busbar second exposed part 222. A front end 222a of the busbar second exposed part 222 is equivalent to a front end of the busbar second terminal 220. The busbar second sheathed part 221 is an example of a "busbar sheathed part" described in the claims.

In the busbar 2, the busbar first terminals 210 and the busbar second terminals 220 are arranged alternately from one end to the other end of the direction along the space between the busbar first terminal 210 and the busbar second terminal 220. In the busbar 2, the busbar first terminals 210 are connected respectively to the second terminals 120 of the semiconductor device 1, and the busbar second terminals 220 are connected respectively to the first terminals 110 of the semiconductor device 1. To allow this connection, the busbar 2 is configured such that the order of arrangement of the busbar first terminals 210 and the busbar second terminals 220 is reverse to the order of arrangement of the first terminals 110 and the second terminals 120 of the semiconductor device 1. In the example of FIG. 4, because the busbar 2 is the busbar that connects three semiconductor devices 1, which are the 2-in-1 power modules, in parallel, six sets of the busbar first terminals 210 and the busbar second terminals 220 are arranged alternately in the −y axis direction. Specifically, in the example of FIG. 4, the busbar second terminal 220 of the first set, the busbar first terminal 210 of the first set, the busbar second terminal 220 of the second set, the busbar first terminal 210 of the second set, the busbar second terminal 220 of the third set, the busbar first terminal 210 of the third set, the busbar second terminal 220 of the fourth set, the busbar first terminal 210 of the fourth set, the busbar second terminal 220 of the fifth set, the busbar first terminal 210 of the fifth set, the busbar second terminal 220 of the sixth set, and the busbar first terminal 210 of the sixth set are arranged in this order in the −y axis direction.

Now, as shown in FIGS. 4 and 6, a distance along the specific direction from the front end 212a of the busbar first exposed part 212 of the busbar first terminal 210 to the molded body 200 is defined as a distance L1. A distance along the specific direction from the front end 221a of the busbar second sheathed part 221 of the busbar second terminal 220 to the molded body 200 is defined as a distance L2. A distance along the given direction from the front end 222a of the busbar second exposed part 222 of the busbar second terminal 220 to the molded body 200 is defined as a distance L3. In the examples of FIGS. 4 and 6, the distance L1 is equivalent to the length of projection of the busbar first terminal 210 from the molded body 200. The distance L2 is equivalent to the length of projection of the busbar second sheathed part 221 of the busbar second terminal 220 from the molded body 200. The distance L3 is equivalent to the length of projection of the busbar second terminal 220 from the molded body 200.

In the comparative example shown in FIG. 6, the length of projection of the busbar second terminal 220 from the molded body 200 is equal to the length of projection of the busbar first terminal 210 from the molded body 200. In addition, the length of projection of the busbar second sheathed part 221 of the busbar second terminal 220 from the molded body 200 is equal to the length of projection of the busbar first sheathed part 211 of the busbar first terminal 210 from the molded body 200. As a matter of course, the length of projection of the busbar second exposed part 222 of the busbar second terminal 220 from the molded body 200 is equal to the length of projection of the busbar first exposed part 212 of the busbar first terminal 210 from the molded body 200. In other words, in the comparative example shown in FIG. 6, the distance L3 and the distance L1 are equal, and the distance L2 is shorter than the distance L1.

In the comparative example shown in FIG. 6, the space distance P between the busbar first terminal 210 and the busbar second terminal 220 is the distance between the busbar first exposed part 212 of the busbar first terminal 210 and the busbar second exposed part 222 of the busbar second terminal 220. The creepage distance Q between the busbar first terminal 210 and the busbar second terminal 220 is the distance to travel through a path starting from the front end 211a of the busbar first sheathed part 211 and extending along respective surfaces of the base end of the busbar first sheathed part 211, the molded body 200, and the base end of the busbar second sheathed part 221 to reach the front end 221a of the busbar second sheathed part 221. In the comparative example shown in FIG. 6, a direction in which the space distance P between the busbar first terminal 210 and the busbar second terminal 220 extends is parallel to the direction along the space between the busbar first terminal 210 and the busbar second terminal 220 (y-axis direction). In the creepage distance Q between the busbar first terminal 210 and the busbar second terminal 220, a part of creepage distance Q that extends along the surface of the busbar second sheathed part 221 of the busbar second terminal 220 and a part of creepage distance Q that extends along the surface of the busbar first sheathed part 211 of the busbar first terminal 210 may match in length.

In contrast, in the busbar 2 shown in FIG. 4, the distance L2 is made longer than the distance L1. In other words, according to the busbar 2 shown in FIG. 4, in the direction along the space between the busbar first terminal 210 and the busbar second terminal 220, the busbar second sheathed part 221 is disposed on the busbar second terminal 220 adjacent to the busbar first exposed part 212 of the busbar first terminal 210. In the busbar 2 shown in FIG. 4, the distance L3 is made longer than the distance L1 so that the distance L2 is longer than the distance L1. Specifically, in the busbar 2 shown in FIG. 4, the length of projection of the busbar second sheathed part 221 of the busbar second terminal 220 from the molded body 200 is longer than the length of projection of the busbar first exposed part 212 of the busbar first terminal 210 from the molded body 200. As a matter of course, the length of projection of the busbar second terminal 220 from the molded body 200 is longer than the length of projection of the busbar first terminal 210 from the molded body 200.

In the busbar 2 shown in FIG. 4, the space distance P between the busbar first terminal 210 and the busbar second terminal 220 is the distance between the front end 212a of the busbar first exposed part 212 of the busbar first terminal 210 and the base end of the busbar second exposed part 222, which is connected to the front end 221a of the busbar second sheathed part 221 of the busbar second terminal 220. The creepage distance Q between the busbar first terminal 210 and the busbar second terminal 220 is the distance to travel through a path starting from the front end 211a of the busbar first sheathed part 211 of the busbar first terminal 210 and extending along respective surfaces of the base end of the busbar first sheathed part 211, the molded body 200, and the base end of the busbar second sheathed part 221 of the busbar second terminal 220 to reach the front end 221a of the busbar second sheathed part 221. In the busbar 2 shown in FIG. 4, because the distance L2 is longer than the distance L1, the direction of the space distance P may be tilted against the direction along the space between the busbar first terminal 210 and the busbar second terminal 220 (y-axis direction). In the busbar 2 shown in FIG. 4, therefore, even if the space between the busbar first terminal 210 and the busbar second terminal 220 is shorter than the space between the same in the comparative example shown in FIG. 6, the necessary space distance P can be secured. In the busbar 2 shown in FIG. 4, because the distance L2 is longer than the distance L1, the part of creepage distance Q that extends along the surface of the busbar second sheathed part 221 of the busbar second terminal 220, the part making up the creepage distance Q between the busbar first terminal 210 and the busbar second terminal 220, may be longer than the part of creepage distance Q that extends along the same in the comparative example shown in FIG. 6. In the busbar 2 shown in FIG. 4, therefore, even if the space between the busbar first terminal 210 and the busbar second terminal 220 is shorter than the space between the same in the comparative example shown in FIG. 6, the necessary creepage distance Q can be secured.

According to the busbar 2 of the first embodiment, because the distance L2 is longer than the distance L1, the space between the busbar first terminal 210 and the busbar second terminal 220 can be shortened as the necessary space distance P and creepage distance Q are secured. In the busbar 2, dimensions in the direction along the space between the busbar first terminal 210 and the busbar second terminal 220 can be reduced, which allows a reduction in the size of the busbar 2. Reducing the size of the busbar 2 allows a reduction in the size of the semiconductor device 1 connected to the busbar 2, thus allowing a reduction in the size of the power converter 3 constructed by connecting the busbar 2 to the semiconductor device 1.

According to the busbar 2 of the first embodiment, because the distance L2 is longer than the distance L1, the busbar second sheathed part 221 is disposed on the busbar second terminal 220 adjacent to the busbar first exposed part 212 of the busbar first terminal 210, in the direction along the space between the busbar first terminal 210 and the busbar second terminal 220. This means that according to the busbar 2, on a portion where a shortest distance is formed between the busbar first terminal 210 and the busbar second terminal 220 adjacent to each other, the sheathed part sheathed with the sheathing material with the insulation property is disposed. When overvoltage is generated between the busbar first terminal 210 and the busbar second terminal 220 as a result of turn-on/off operations or the like, therefore, the busbar 2 can suppress the occurrence of an electrical short circuit between the busbar first terminal 210 and the busbar second terminal 220. The busbar 2 is thus able to improve its insulation performance and reliability. Because the reliability of the busbar 2 is improved, the reliability of the power converter 3 constructed by connecting the busbar 2 to the semiconductor device 1 can be improved, too.

Furthermore, according to the busbar 2 of the first embodiment, by shortening the space between the busbar first terminal 210 connected to the DC positive terminal and the busbar second terminal 220 connected to the DC negative terminal, a mutual inductance between the busbar first terminal 210 and the busbar second terminal 220 can be increased. As a result, the busbar 2 can reduce an overall combined inductance between the semiconductor device 1 and the busbar 2, which make up the power converter 3, thus being able to reduce overvoltage and noise resulting from turn on/off operations or the like.

In the busbar 2, when the distance L2 is longer than the distance L1, the space between the busbar first terminal 210 and the busbar second terminal 220 can be shortened as the necessary insulation distance is secured. In this case, the busbar first terminal 210 having the busbar first sheathed part 211 is not a prerequisite. However, in the busbar 2, the busbar first terminal 210 having the busbar first sheathed part 211 makes securing the necessary creepage distance Q easier than in a case of the busbar first terminal 210 not having the busbar first sheathed part 211, and therefore allows s further shortening of the space between the busbar first terminal 210 and the busbar second terminal 220. The busbar first terminal 210 having the busbar first sheathed part 211 thus allows a reduction in the size of the device, an improvement in the insulation performance and the reliability, and a reduction in the combined inductance, and is therefore preferable.

Figure 7:
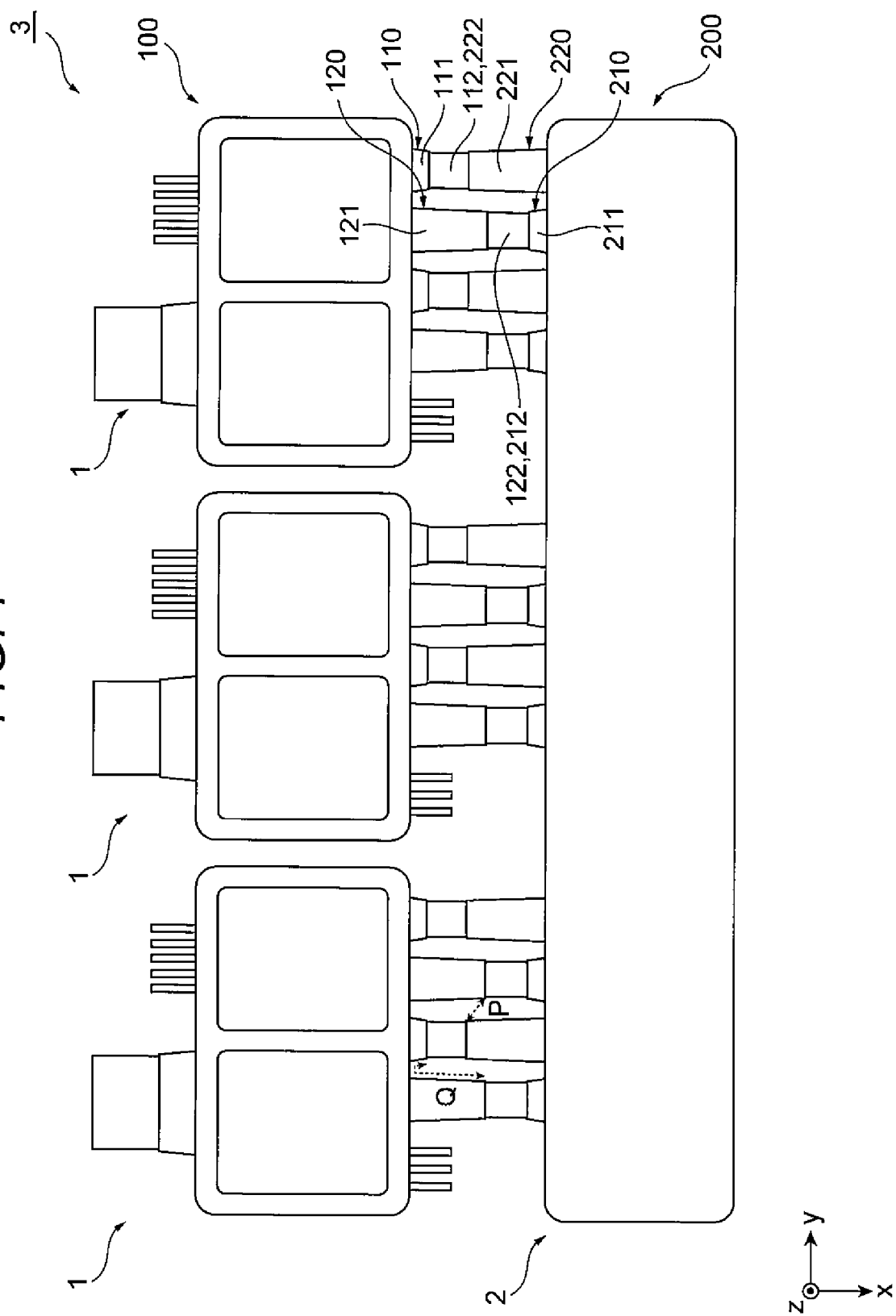
FIG. 7 is an external view of a power converter according to the first embodiment.
Figure 8:
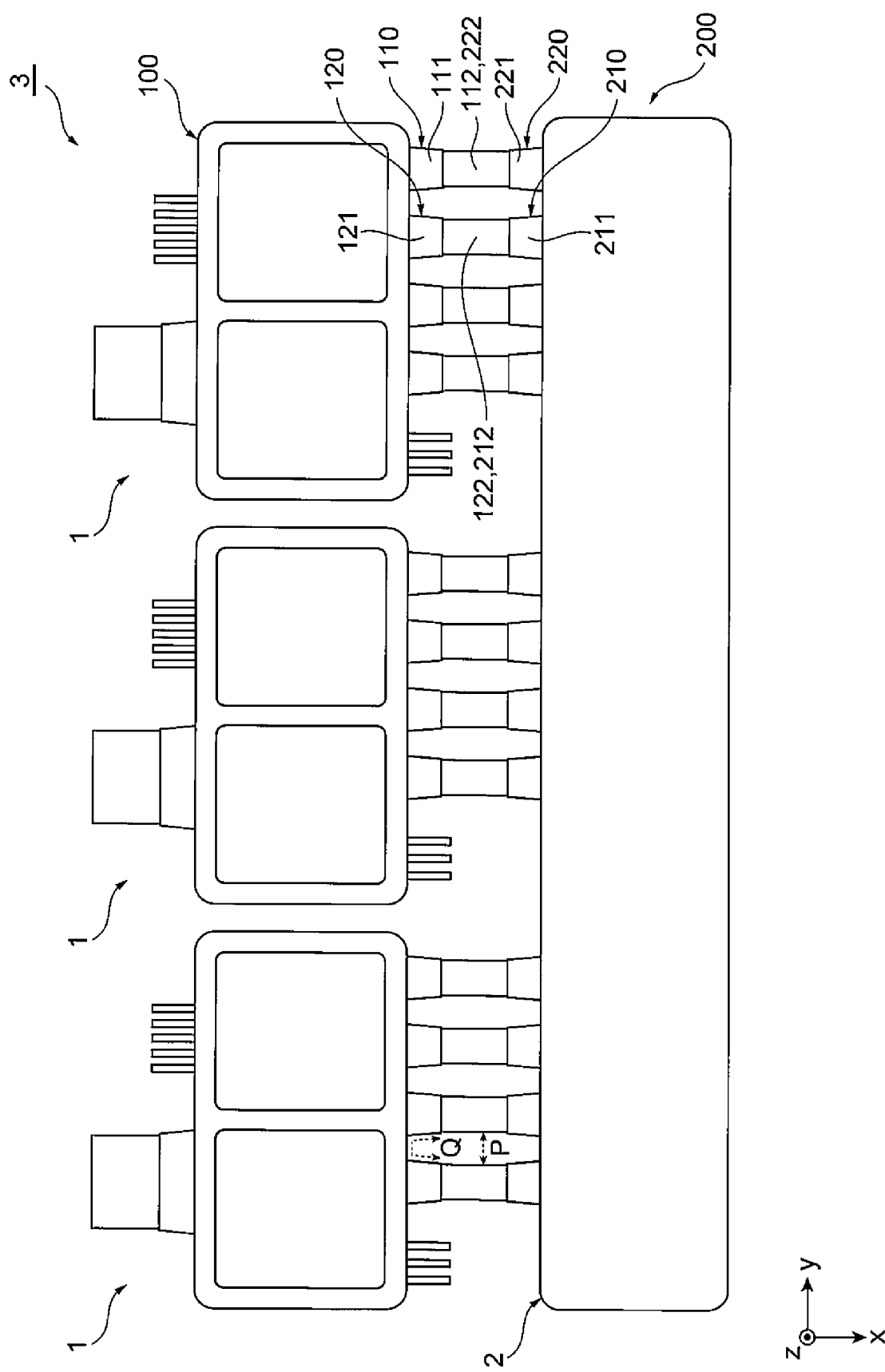
FIG. 8 depicts a comparative example of the power converter shown in FIG. 7.

FIG. 7 is an external view of the power converter 3 according to the first embodiment. FIG. 8 depicts a comparative example of the power converter 3 shown in FIG. 7.

The power converter 3 includes the semiconductor devices 1 and the busbar 2 connected to the semiconductor devices 1. In the power converter 3 shown in FIG. 7, three semiconductor devices 1 of FIG. 1, which are the 2-in-1 power modules, are connected in parallel to the busbar 2 shown in FIG. 4. In the power converter 3 shown in FIG. 7, a capacitor module (not illustrated) is connected to the busbar 2 shown in FIG. 4.

In the power converter 3, as shown in FIG. 7, each semiconductor device 1 and the busbar 2 are set in a position in which the given direction in which the first terminal 110 and the second terminal 120 project and the specific direction in which the busbar first terminal 210 and the busbar second terminal 220 project are the same direction. In the power converter 3, the semiconductor device 1 and the busbar 2 are set in a position in which the first terminal 110 is counter to the busbar second terminal 220 and the second terminal 120 is counter to the busbar first terminal 210. Furthermore, in the power converter 3, the semiconductor device 1 and the busbar 2 are set in a position in which the direction of projection of the first terminal 110 and the second terminal 120 (+x-axis direction) is opposite to the direction of projection of the busbar first terminal 210 and the busbar second terminal 220 (−x-axis direction).

In the power converter 3, the semiconductor device 1 and the busbar 2 are connected by connecting the first exposed part 112 of the first terminal 110 to the busbar second exposed part 222 of the busbar second terminal 220 and connecting the second exposed part 122 of the second terminal 120 to the busbar first exposed part 212 of the busbar first terminal 210. Specifically, in the power converter 3 shown in FIG. 7, the first exposed part 112 and the busbar second exposed part 222 are set overlapping each other in the z-axis direction as the second exposed part 122 and the busbar first exposed part 212 are set overlapping each other in the z-axis direction, and their respective overlapping parts are connected by welding or the like. As a result, in the power converter 3, the distance D2 is made longer than the distance D1 in the semiconductor device 1, and the distance L2 is made longer than the distance L1 in the busbar 2. In addition, in the power converter 3 shown in FIG. 7, the sum of the distance D1 and the distance L2 is equal to the sum of the distance D2 and the distance L1 in the semiconductor device 1 and the busbar 2.

It is preferable that the first exposed part 112 be connected to the busbar second exposed part 222 and the second exposed part 122 be connected to the busbar first exposed part 212, by tungsten inert gas (TIG) welding. These exposed parts, however, may be connected by a welding method different from TIG welding, such as laser welding or resistance welding, or by a mechanical connection method, such as ultrasonic welding or screw fastening.

In the power converter 3 of the first embodiment, as mentioned in the above description of the semiconductor device 1 shown in FIG. 1 and the busbar 2 shown in FIG. 4, the distance D2 is longer than the distance D1 and the distance L2 is longer than the distance L1. In the comparative example shown in FIG. 8, in contrast, as mentioned in the above description of the semiconductor device 1 of the comparative example shown in FIG. 3 and the busbar 2 of the comparative example shown in FIG. 6, the distance D2 is shorter than the distance D1 and the distance L2 is shorter than the distance L1.

In the power converter 3 of the first embodiment, a space between a set of the first terminal 110 and the busbar second terminal 220 and a set of the second terminal 120 and the busbar first terminal 210 can be shortened as the necessary space distance P and creepage distance Q of the space are secured. In the power converter 3, dimensions of the semiconductor device 1 and the busbar 2 in the direction along the space can be reduced, which allows a reduction in the size of the power converter 3.

According to the power converter 3 of the first embodiment, on a portion where a shortest distance is formed between the set of the first terminal 110 and the busbar second terminal 220 and the set of the second terminal 120 and the busbar first terminal 210, both sets being adjacent to each other, the sheathed parts with the insulation property are disposed. When overvoltage is generated in the space between the set of the first terminal 110 and the busbar second terminal 220 and the set of the second terminal 120 and the busbar first terminal 210, as a result of turn-on/off operations or the like, therefore, the power converter 3 can suppress the occurrence of an electrical short circuit in the space. The power converter 3 is thus able to improve its insulation performance and reliability.

Furthermore, the power converter 3 of the first embodiment can increase a mutual inductance between the set of the first terminal 110 and the busbar second terminal 220 and the set of the second terminal 120 and the busbar first terminal 210. The power converter 3, therefore, can reduce an overall combined inductance between the semiconductor device 1 and the busbar 2, thus being able to reduce overvoltage and noise resulting from turn on/off operations or the like.

In the power converter 3 of the first embodiment, the semiconductor device 1 and the busbar 2 are set in the position in which the first terminal 110 is counter to the busbar second terminal 220 and the second terminal 120 to the busbar first terminal 210. Furthermore, the semiconductor device 1 and the busbar 2 are set in the position in which the side to which the first terminal 110 and the second terminal 120 project and the side to which the busbar first terminal 210 and the busbar second terminal 220 project are opposite to each other. As a result, in the power converter 3, a connected part between the first terminal 110 and the busbar second terminal 220 and a connected part between the second terminal 120 and the busbar first terminal 210 are arranged such that the connected parts shift alternately to a side closer to the sealing body 100 and to a side closer to the molded body 200 with respect to a midline between the sealing body 100 and the molded body 200. According to the power converter 3, respective spaces between sets of the first terminals 110 and the busbar second terminals 220 and sets of the second terminals 120 and the busbar first terminals 210 can be further shortened all across the power converter 3 as the necessary space distance P and creepage distance Q are secured. Hence the power converter 3 allows a reduction in the size of the device, an improvement in the insulation performance and reliability, and a reduction in the combined inductance.

According to the power converter 3 of the first embodiment, the sum of the distance D1 and the distance L3 is equal to the sum of the distance D3 and the distance L1 in the semiconductor device 1 and the busbar 2. According to the power converter 3, respective lengths of projection of groups of the terminals 110, 120, 210, and 220, which project between the sealing body 100 and the molded body 200, are made equal as a whole in the power converter 3. According to the power converter 3, respective lengths of projection of the groups of the terminals 110, 120, 210, and 220, which project between the sealing body 100 and the molded body 200, can be reduced as a whole in the power converter 3. The power converter 3, therefore, can reduce a self-inductance of the groups of the terminals 110, 120, 210, and 220, which project between the sealing body 100 and the molded body 200, thus being able to further reduce an overall combined inductance of the power converter 3. The power converter 3 can reduce dimensions in a direction along a space between the sealing body 100 and the molded body 200, which allows a further reduction in the size of the power converter 3.

Second Embodiment

A semiconductor device 1, a busbar 2, and a power converter 3 according to a second embodiment will be described with reference to FIGS. 9 to 14. In describing the second embodiment, description of the same configurations and operations as those of the first embodiment will be omitted.

Figure 14:
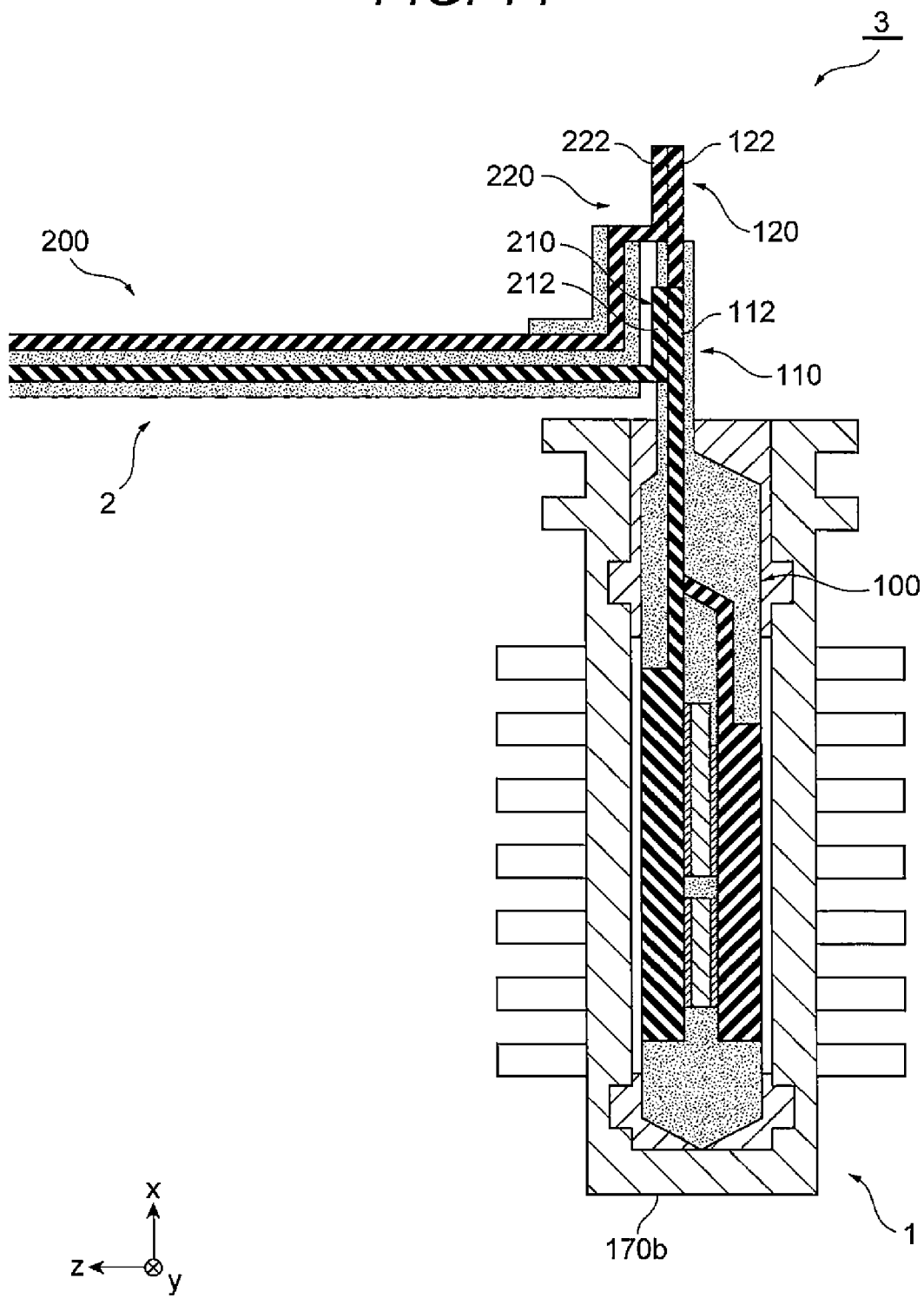
FIG. 14 is a cross-sectional view of a power converter according to the second embodiment.

As shown in FIG. 14, which will be described later, the semiconductor device 1 of the second embodiment is set in a position in which the given direction in which the first terminal 110 and the second terminal 120 project is along an upper-to-lower direction. In this embodiment, in the upper-to-lower direction, a side closer to a bottom 170b of a case 170 of the semiconductor device 1 is referred to as "lower side", and a side distant away from the bottom 170b of the case 170 is referred to as "upper side".

Figure 9:
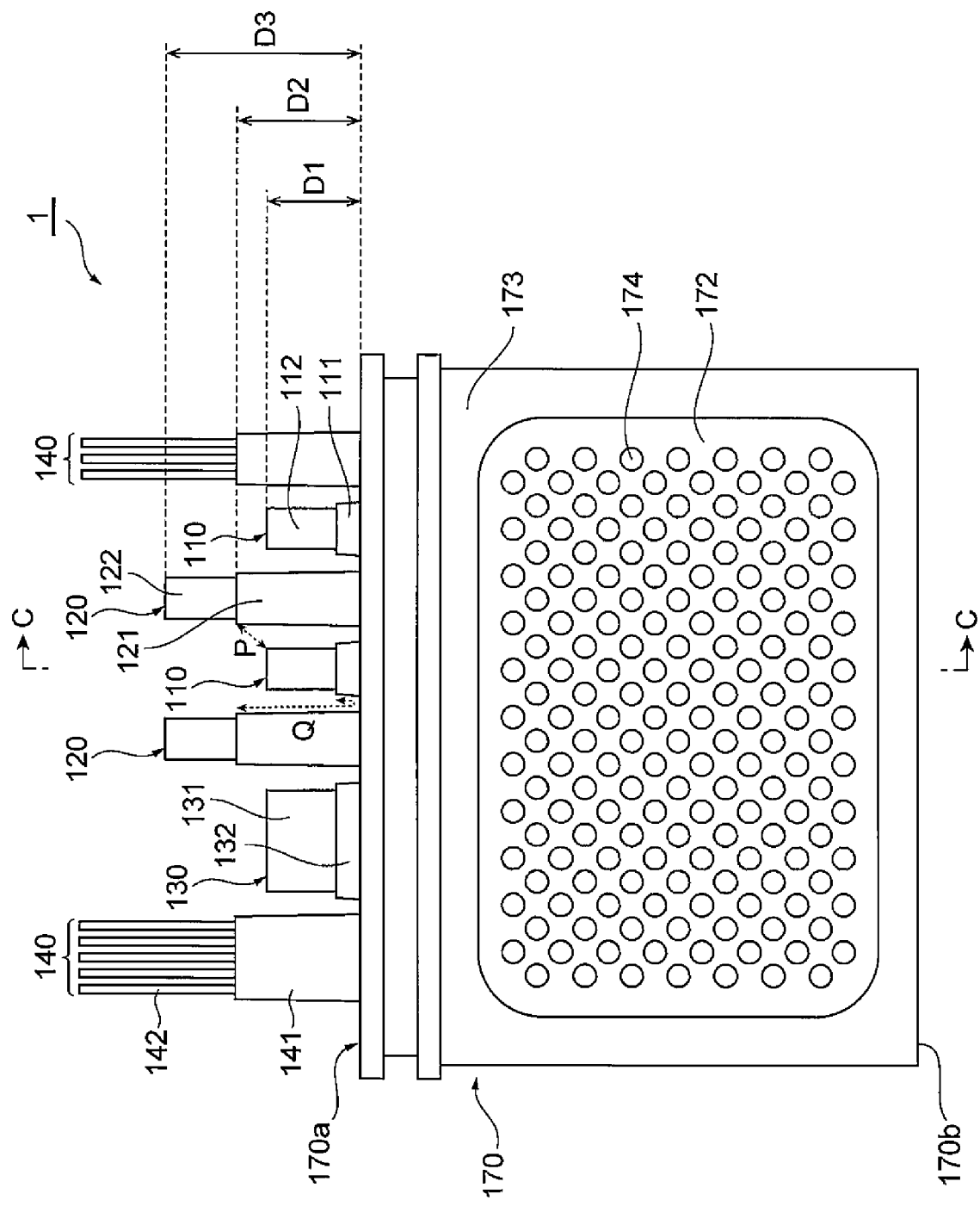
FIG. 9 is an external view of a semiconductor device according to a second embodiment.
Figure 10:
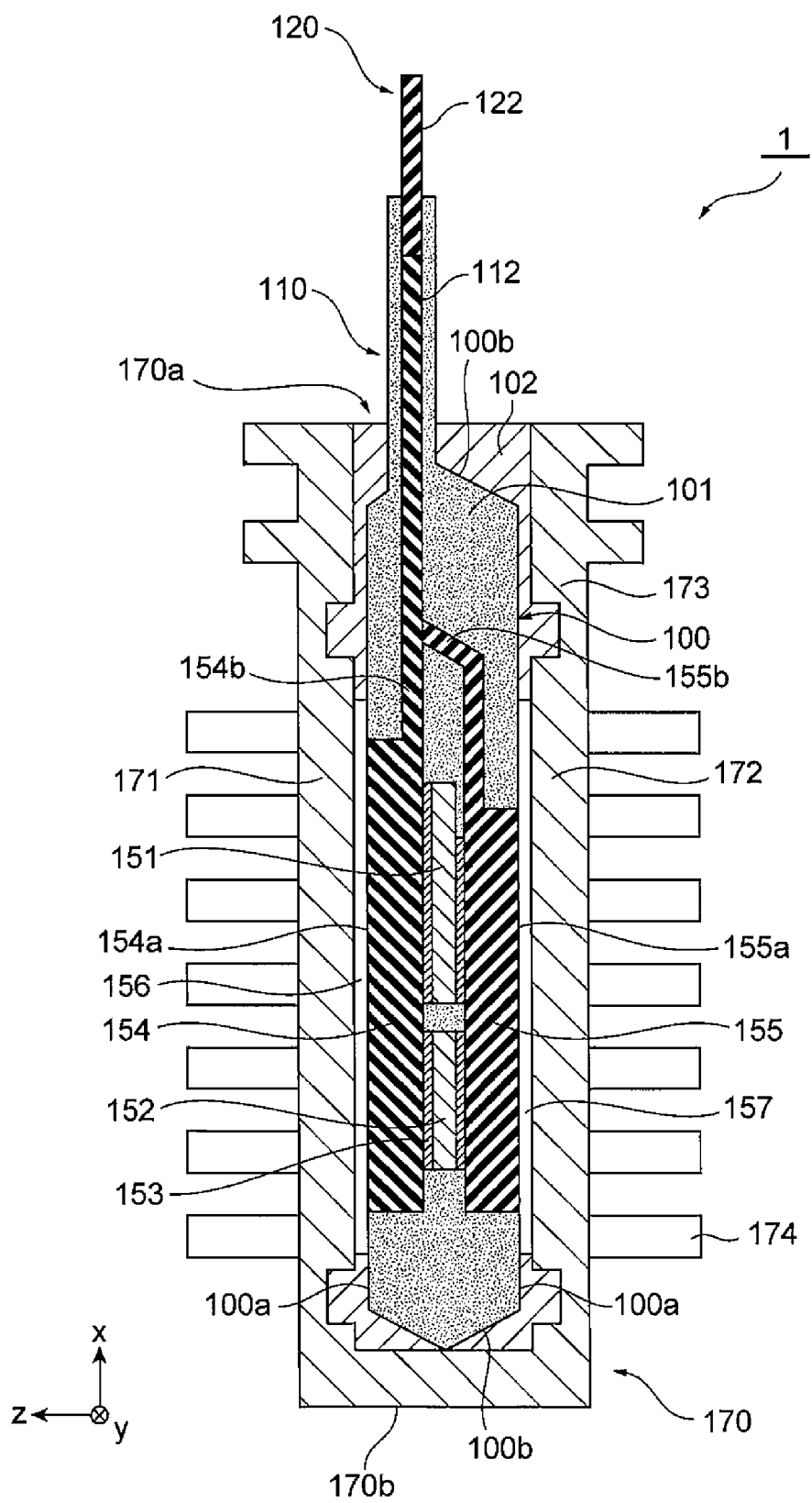
FIG. 10 is a cross-sectional view of the semiconductor device, the cross-sectional view being taken along a line C-C shown in FIG. 9.

FIG. 9 is an external view of the semiconductor device 1 according to the second embodiment. FIG. 10 is a cross-sectional view of the semiconductor device 1, the cross-sectional view being taken along a line C-C shown in FIG. 9.

The semiconductor device 1 of the second embodiment includes the case 170 in which the sealing body 100 is housed. The case 170 is made of a metal material with excellent thermal conductivity, such as copper or aluminum, and is formed into a flat cylindrical shape. The case 170 includes a pair of a first heat-dissipating board 171 and a second heat-dissipating board 172, and a frame 173. The first heat-dissipating board 171 and the second heat-dissipating board 172 are counter to each other across a space therebetween in a direction perpendicular to the main surface 100a of the sealing body 100, and are each disposed along the main surface 100a of the sealing body 100. Between the first heat-dissipating board 171 and the second heat-dissipating board 172, an internal space of the case 170 is formed. Outer surfaces of the first heat-dissipating board 171 and the second heat-dissipating board 172 are provided respectively with a plurality of fins 174 extending outward. The frame 173 fixes the first heat-dissipating board 171 and the second heat-dissipating board 172. The frame 173 is connected to the first heat-dissipating board 171 and the second heat-dissipating board 172 by laser welding or the like. The case 170 has an opening 170a formed on one end, and the bottom 170b disposed on the other end.

On the sealing body 100 of the second embodiment, the first terminals 110, the second terminals 120, the output terminal 130, and the control terminals 140 all project from one side surface 100b of the sealing body 100 along the given direction in the same direction of projection. The sealing body 100 housed in the case 170 is disposed such that the terminals 110 to 140 extending along the given direction each project from the opening 170a toward outside of the case 170.

In the sealing body 100 of the second embodiment, the first circuit conductor 154 and the second circuit conductor 155 each have a lead frame structure. The first circuit conductor 154 and the second circuit conductor 155 have a lead 154b and a lead 155b, respectively. The lead 154b of the first circuit conductor 154 and the lead 155b of the second circuit conductor 155 are formed integrally with the first terminal 110, the second terminal 120, and the output terminal 130. According to the sealing body 100 of the second embodiment, because the first circuit conductor 154 and the second circuit conductor 155 are housed in the case 170 provided with the first heat-dissipating board 171 and the second heat-dissipating board 172, the sealing body 100 dispenses with the first heat-dissipating conductor 158 and the second heat-dissipating conductor 159. The first circuit conductor 154 and the second circuit conductor 155 are molded such that a surface 154a and a surface 155a are exposed from the resin material 101, the surface 154a and the surface 155a being opposite respectively to surfaces bonded to the first semiconductor element 151 and the second semiconductor element 152.

In the sealing body 100 of the second embodiment, the first insulating layer 156 and the second insulating layer 157 are disposed respectively on the surface 154a and the surface 155a of the first circuit conductor 154 and the second circuit conductor 155, the surface 154a and the surface 155a being exposed from the resin material 101. The sealing body 100 is housed in the case 170 in a state in which the first insulating layer 156 and the second insulating layer 157 are disposed respectively on the surface 154a and the surface 155a of the first circuit conductor 154 and the second circuit conductor 155, the surface 154a and the surface 155a being exposed from the resin material 101. In other words, the first insulating layer 156 and the second insulating layer 157 of the second embodiment are retrofitted to the sealing body 100. To the sealing body 100, the first insulating layer 156, and the second insulating layer 157 that are housed in the case 170, pressure is applied via the first heat-dissipating board 171 and the second heat-dissipating board 172 of the case 170. As a result, the first insulating layer 156 and the second insulating layer 157 are bonded respectively to the surface 154a and the surface 155a of the sealing body 100, the surface 154a and the surface 155a being exposed from the resin material 101, respectively, and are bonded respectively to the first insulating layer 156 and the second insulating layer 157. The case 170, in which the sealing body 100, the first insulating layer 156, and the second insulating layer 157 are housed, is filled with a resin material 102 by potting.

The control terminal 140 of the second embodiment has a fourth sheathed part 141 projecting from the sealing body 100, the fourth sheathed part 141 extending in the given direction and being sheathed with an insulating material, and a fourth exposed part 142 projecting from the fourth sheathed part 141, the fourth exposed part 142 extending in the given direction and being exposed outside the sealing body 100. The insulating material forming the fourth sheathed part 141 may be the same material as the resin material 101, or may be a resin material different from the resin material 101. The control terminals 140 are disposed respectively on both ends of the side surface 100b of sealing body 100 so that the control terminals 140 are separated from each other.

In the semiconductor device 1 shown in FIG. 9, one control terminal 140, the first terminal 110 of the first set, the second terminal 120 of the first set, the first terminal 110 of the second set, and the second terminal 120 of the second set, the output terminal 130, and the other control terminal 140 are arranged in this order along the −y axis direction. According to the semiconductor device 1 of the second embodiment, in the direction along the space between the first terminal 110 and the second terminal 120, the second sheathed part 121 is disposed on the second terminal 120 adjacent to the first exposed part 112 of the first terminal 110, and the fourth sheathed part 141 is disposed on the control terminal 140 adjacent to the first exposed part 112 of the first terminal 110. According to the semiconductor device 1 of the second embodiment, in the direction along the space between the first terminal 110 and the second terminal 120, the second sheathed part 121 is disposed on the second terminal 120 adjacent to the output terminal 130, and the fourth sheathed part 141 is disposed on the control terminal 140 adjacent to the output terminal 130.

In the semiconductor device 1 of the second embodiment, as shown in FIG. 9, the distance D2 is longer than the distance D1 as is in the first embodiment. According to the semiconductor device 1 of the second embodiment, in the same manner as in the first embodiment, the second sheathed part 121 is disposed on the second terminal 120 adjacent to the first exposed part 112 of the first terminal 110, in the direction along the space between the first terminal 110 and the second terminal 120. The semiconductor device 1 of the second embodiment thus allows a reduction in the size of the device, an improvement in the insulation performance and reliability, and a reduction in the combined inductance, in the same manner as in the first embodiment.

Figure 11:
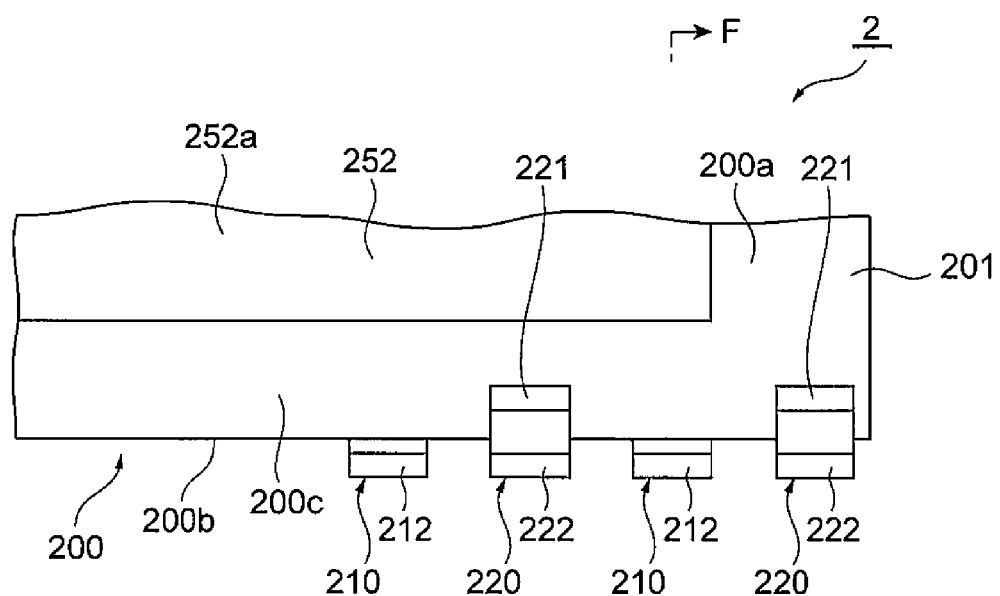
FIG. 11 is a top view of a busbar according to the second embodiment.
Figure 12:
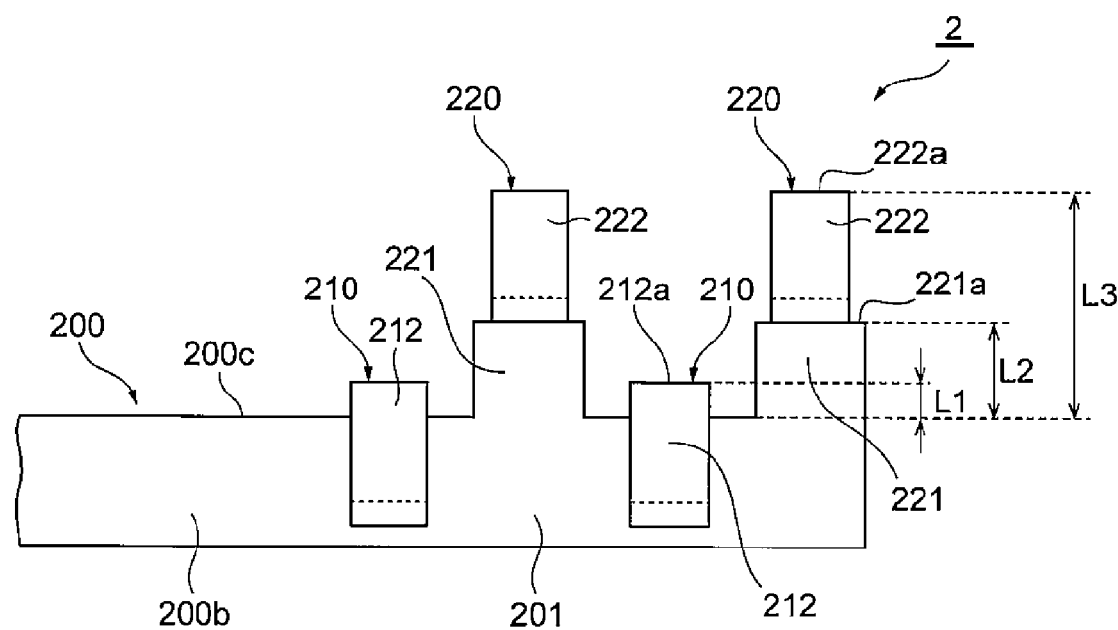
FIG. 12 is a side view of the busbar, the side view being given when the busbar is seen in the direction of an arrow E shown in FIG. 11.
Figure 13:
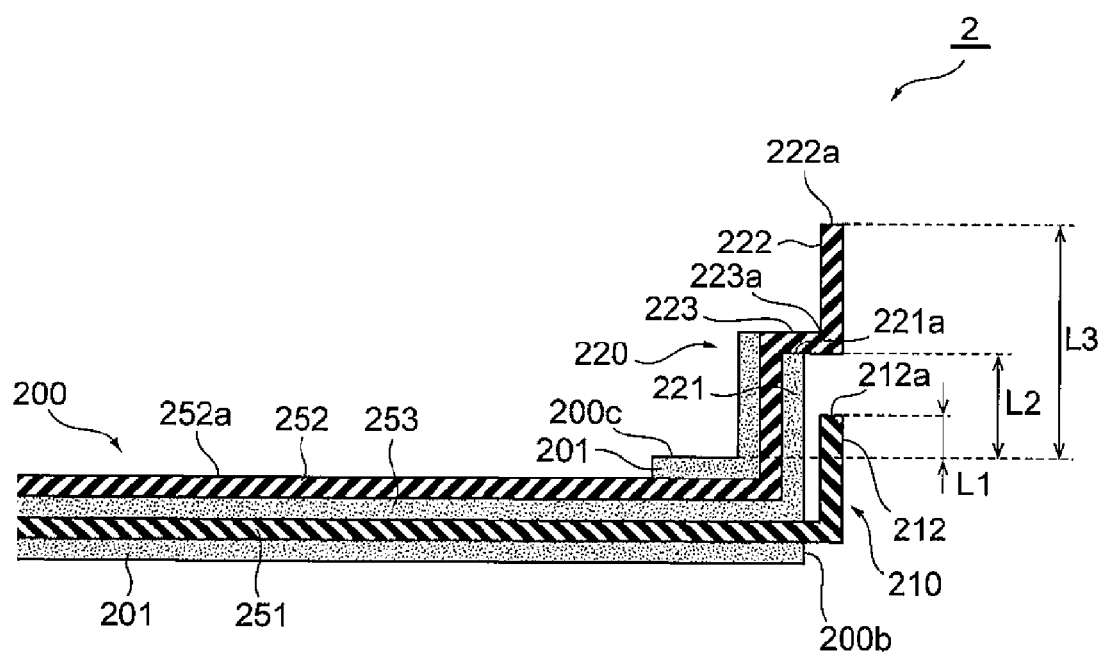
FIG. 13 is a cross-sectional view of the busbar, the cross-sectional view being taken along a line F-F shown in FIG. 11.

FIG. 11 is a top view of the busbar 2 according to the second embodiment. FIG. 12 is a side view of the busbar 2, the side view being given when the busbar 2 is seen in the direction of an arrow E shown in FIG. 11. FIG. 13 is a cross-sectional view of the busbar 2, the cross-sectional view being taken along a line F-F shown in FIG. 11.

As shown in FIG. 13, in the molded body 200 included in the busbar 2 of the second embodiment, a first conductor plate 251, an insulating layer 253, and a second conductor plate 252 are stacked in this order, and are resin-molded by injection molding or the like, using the resin material 201. The molded body 200 has the main surface 200a along the first conductor plate 251 and the second conductor plate 252. The molded body 200 is set in a posture in which a direction along the main surface 200a intersects the given direction and the specific direction.

As shown in FIG. 11, the molded body 200 is molded such that the second conductor plate 252 is exposed from the resin material 201 on an upper surface 200c that is one of the main surfaces 200a. An upper surface 252a of the second conductor plate 252 exposed from the resin material 201 is covered with a resin different from the resin material 201, by potting or the like. The upper surface 200c of the molded body 200 is the one main surface 200a that is closer to the second conductor plate 252 connected to the busbar second terminal 220 than to the first conductor plate 251 connected to the busbar first terminal 210. In other words, the upper surface 200c of the molded body 200 is the one main surface 200a that is separated farther from the first conductor plate 251 connected to the busbar first terminal 210 than from the second conductor plate 252 connected to the busbar second terminal 220.

As shown in FIGS. 12 and 13, the busbar first terminal 210 of the second embodiment extends from the side surface 200b of the molded body 200 along a direction perpendicular to a direction along the first conductor plate 251 and the second conductor plate 252, and projects beyond the upper surface 200c that is the one main surface 200a of the molded body 200. Specifically, the busbar first terminal 210 projects from the side surface 200b of the molded body 200, the side surface 200b intersecting the direction along the upper surface 200c that is the one main surface 200a of the molded body 200, to extend further beyond the upper surface 200c that is the one main surface 200a closer to the second conductor plate 252 than to the first conductor plate 251. The specific direction along which the busbar first terminal 210 projects is the direction perpendicular to the upper surface 200c extending along the first conductor plate 251 and the second conductor plate 252. The direction of projection of the busbar first terminal 210 is the direction of heading from the first conductor plate 251 toward the second conductor plate 252. In the example of FIG. 13, the direction of projection of the busbar first terminal 210 is the +x-axis direction.

The busbar first terminal 210 has the busbar first exposed part 212 extending in the specific direction and exposed outside the molded body 200, but may not have the busbar first sheathed part 211. In other words, the busbar first terminal 210 of the second embodiment may be composed of the busbar first exposed part 212 only. The front end 212a of the busbar first exposed part 212 is equivalent to the front end of the busbar first terminal 210, and projects beyond the upper surface 200c that is the one main surface 200a of the molded body 200. The upper surface 200c, which is the one main surface 200a of the molded body 200, is closer to the front end 212a of the busbar first exposed part 212 than the other main surface 200a is.

As shown in FIGS. 12 and 13, the busbar second terminal 220 of the second embodiment projects from the upper surface 200c of the molded body 200, the upper surface 200c being located near the side surface 200b provided with the busbar first terminal 210, along the specific direction in the direction of projection that is the same as the direction of projection of the busbar first terminal 210. The busbar second terminal 220 includes the busbar second sheathed part 221 projecting from the upper surface 200c of the molded body 200, the busbar second sheathed part 221 extending in the specific direction and being sheathed with the sheathing material with the insulation property, and the busbar second exposed part 222 projecting from the busbar second sheathed part 221, the busbar second exposed part 222 extending in the specific direction and being exposed outside the molded body 200.

The busbar second sheathed part 221 projects from the upper surface 200c, which is the main surface 200a beyond which the busbar first exposed part 212 projects out, in the direction of going away from the upper surface 200c in such a way as to project beyond the front end 212a of the busbar first exposed part 212. In the example of FIG. 13, the busbar second sheathed part 221 projects from the upper surface 200c along the specific direction, in which the busbar first exposed part 212 extends, in the direction of projection that is the same as the direction of projection of the busbar first exposed part 212 in such a way as to project beyond the front end 212a of the busbar first exposed part 212. In the example of FIG. 13, the direction of projection of the busbar first exposed part 212 is the +x-axis direction.

The busbar second exposed part 222 has a bent part 223 that is bent in the direction of heading from the front end 221a of the busbar second sheathed part 221 toward the side surface 200b provided with the busbar first terminal 210 along the upper surface 200c. In the example of FIG. 13, the direction of heading toward the side surface 200b is a −z-axis direction. The busbar second exposed part 222 projects from the front end 223a of the bent part 223 in the direction of going away from the front end 212a of the busbar first exposed part 212. In the example of FIG. 13, the busbar second exposed part 222 projects from the front end 223a of the bent part 223 along the specific direction, in which the busbar first exposed part 212 extends, in the direction of projection that is the same as the direction of projection of the busbar first exposed part 212.

In the busbar 2 of the second embodiment, as shown in FIGS. 12 and 13, the distance L2 is longer than the distance L1 in the same manner as in the busbar 2 of the first embodiment. According to the busbar 2 of the second embodiment, in the direction along the space between the busbar first terminal 210 and the busbar second terminal 220, the busbar second sheathed part 221 is disposed on the busbar second terminal 220 adjacent to the busbar first exposed part 212 of the busbar first terminal 210, in the same manner as in the first embodiment. As a result, the busbar 2 of the second embodiment allows a reduction in the size of the device, an improvement in the insulation performance and reliability, and a reduction in the combined inductance, as the busbar 2 of the first embodiment does.

In the busbar 2 of the second embodiment, the busbar first exposed part 212 of the busbar first terminal 210 projects from the molded body 200 in such a way as to project beyond the upper surface 200c that is the main surface 200a closer to the second conductor plate 252 than to the first conductor plate 251. The busbar second sheathed part 221 of the busbar second terminal 220 projects from the upper surface 200c, beyond which the busbar first exposed part 212 projects out, in the direction of going away from the upper surface 200c in such a way as to project beyond the front end 212a of the busbar first exposed part 212. The busbar second exposed part 222 of the busbar second terminal 220 has the bent part 223 that is bent in the direction of heading from the front end 221a of the busbar second sheathed part 221 toward the side surface 200b, and projects from the front end 223a of the bent part 223 to the direction of going away from the front end 212a of the busbar first exposed part 212. As a result, in the busbar 2 of the second embodiment, the length of the busbar second sheathed part 221 can be reduced to be shorter than the length in a case where the busbar first exposed part 212 projects from the molded body 200 in such a way as to project beyond the main surface 200a closer to the first conductor plate 251. The busbar 2, therefore, can secure the necessary space distance P and creepage distance Q without making the busbar second sheathed part 221 excessively long, and can reduce the self-inductance of the busbar second terminal 220. Hence the busbar 2 can reduce the overall combined inductance between the semiconductor device 1 and the busbar 2 that make up the power converter 3.

FIG. 14 is a cross-sectional view of the power converter 3 according to the second embodiment. FIG. 14 shows a state in which the semiconductor device 1 of the second embodiment shown in FIG. 10 is connected to the busbar 2 of the second embodiment shown in FIG. 13.

In the power converter 3 of the second embodiment, as shown in in FIG. 14, the semiconductor device 1 and the busbar 2 are set in a position in which the given direction in which the first terminal 110 and the second terminal 120 project and the specific direction in which the busbar first terminal 210 and the busbar second terminal 220 project are the same. In the power converter 3, the semiconductor device 1 and the busbar 2 are set in a position in which the first terminal 110 is counter to the busbar first terminal 210 and the second terminal 120 is counter to the busbar second terminal 220. In addition, in the power converter 3, the semiconductor device 1 and the busbar 2 are set in a position in which the direction of projection of the first terminal 110 and the second terminal 120 (+x-axis direction) and the direction of projection of the busbar first terminal 210 and the busbar second terminal 220 (+x-axis direction) are the same. In other words, in the power converter 3 of the second embodiment, the semiconductor device 1 and the busbar 2 are set in a position in which the direction along the main surface 200a of the molded body 200 intersects the given direction and the specific direction. In the power converter 3 shown in the example of FIG. 14, the semiconductor device 1 and the busbar 2 are set in a position in which the direction along the main surface 200a of the molded body 200 is perpendicular to the given direction and the specific direction. Further, in the power converter 3, the semiconductor device 1 and the busbar 2 are set in a position in which the second conductor plate 252 is located above the first conductor plate 251. In other words, the semiconductor device 1 and the busbar 2 are set in a position in which the second conductor plate 252 is separated farther from the sealing body 100 along the given direction and the specific direction than the first conductor plate 251 is.

According to the power converter 3, in the semiconductor device 1 and the busbar 2, the first exposed part 112 of the first terminal 110 is connected to the busbar first exposed part 212 of the busbar first terminal 210, and the second exposed part 122 of the second terminal 120 is connected to the busbar second exposed part 222 of the busbar second terminal 220. Specifically, in the power converter 3 in the example of FIG. 14, the first exposed part 112 and the busbar first exposed part 212 are set overlapping each other in the z-axis direction as the second exposed part 122 and the busbar second exposed part 222 are set overlapping each other in the z-axis direction, and their respective overlapping parts are connected by welding or the like.

In the power converter 3 of the second embodiment, the distance D2 is longer than the distance D1 and the distance L2 is longer than the distance L1 in the same manner as in the first embodiment. According to the power converter 3 of the second embodiment, on a portion where a shortest distance is formed between a set of the first terminal 110 and the busbar first terminal 210 and a set of the second terminal 120 and the busbar second terminal 220, both sets being adjacent to each other, the sheathed parts with the insulation property are disposed in the same manner as in the first embodiment. Hence the power converter 3 of the second embodiment allows a reduction in the size of the device, an improvement in the insulation performance and reliability, and a reduction in the combined inductance, as the power converter 3 of the first embodiment does.

According to the power converter 3 of the second embodiment, the semiconductor device 1 and the busbar 2 are set in the position in which the first terminal 110 is counter to the busbar first terminal 210 and the second terminal 120 is counter to the busbar second terminal 220. In addition, in the power converter 3, the first terminal 110 and the second terminal 120 are arranged in the same orientation as the orientation of the busbar first terminal 210 and the busbar second terminal 220. Because of this configuration, according to the power converter 3, even when the direction along the main surface 200a of the molded body 200 intersects the given direction and the specific direction, the semiconductor device 1 and the busbar 2 can be connected in such a way as to simultaneously achieve securing of the space distance P and creepage distance Q, a reduction in the size of the device, and a reduction in the combined inductance.

In the power converter 3 of the second embodiment, the busbar first exposed part 212 of the busbar first terminal 210 projects from the molded body 200 in such a way as to project beyond the upper surface 200c that is the main surface 200a closer to the second conductor plate 252 than to the first conductor plate 251. In the power converter 3, the busbar second sheathed part 221 of the busbar second terminal 220 projects from the upper surface 200c, beyond which the busbar first exposed part 212 projects out, in the direction of going away from the upper surface 200c in such a way as to project beyond the front end 212a of the busbar first exposed part 212. In the power converter 3, the busbar second exposed part 222 of the busbar second terminal 220 has the bent part 223 that is bent in the direction of heading from the front end 221a of the busbar second sheathed part 221 toward the side surface 200b, and projects from the front end 223a of the bent part 223 to the direction of going away from the front end 212a of the busbar first exposed part 212.

As a result, in the power converter 3 of the second embodiment, the length of the busbar second sheathed part 221 can be reduced to be shorter than the length in the case where the busbar first exposed part 212 projects from the molded body 200 in such a way as to project beyond the main surface 200a closer to the first conductor plate 251. The power converter 3, therefore, can reduce the self-inductance of the busbar second terminal 220, thus being able to reduce the overall combined inductance of the power converter 3. In the power converter 3, the busbar first terminal 210 and the busbar second terminal 220 project to be above the upper surface 200c of the molded body 200. In other words, the busbar first terminal 210 and the busbar second terminal 220 project to the direction of being separated farther away from the sealing body 100 than the upper surface 200c of the molded body 200 is. As a result, a connecting part where the first terminal 110 is connected to the busbar first terminal 210 and a connecting part where the second terminal 120 is connected to the busbar second terminal 220 are located on a side that is separated farther away from the sealing body 100 than the upper surface 200c of the molded body 200 is. According to the power converter 3, therefore, work of connecting the semiconductor device 1 to the busbar 2 can be done easily.

[Others]

It should be noted that the present invention is not limited to the above embodiments but includes various modifications.

For example, the above embodiments have been described in detail for easy understanding of the present invention, and are not necessarily limited to an embodiment including all constituent elements described above. Some constituent elements of a certain embodiment may be replaced with constituent elements of another embodiment, and a constituent element of another embodiment may be added to a constituent element of a certain embodiment. In addition, some of constituent elements of each embodiment can be deleted therefrom or add to or replaced with constituent elements of another embodiment.

Some or all of the above constituent elements, functions, processing units, processing means, and the like may be provided as hardware, such as properly designed integrated circuits. In addition, the above-described constituent elements, functions, and the like may be provided in the form of software-based programs by causing a processor to interpret and execute programs for implementing the constituent elements/functions. Information for implementing functions, such as programs, tables, and files, may be stored in a storage device, such as a memory, a hard disk, and a solid state drive (SSD), or in a recording medium, such as an IC card, an SD card, and a DVD.

A group of control lines/information lines considered to be necessary for description are illustrated, and all control lines/information lines making up the product are not necessarily illustrated. It is safe to assume that, actually, almost the entire constituent elements are interconnected.

REFERENCE SIGNS LIST 1 semiconductor device
2 busbar
3 power converter
100 sealing body
110 first terminal
112 first exposed part
112a front end
120 second terminal
121 second sheathed part (sheathed part)
121a front end
122 second exposed part
122a front end
151 first semiconductor element
152 second semiconductor element
200 molded body
200a main surface
200b side surface
200c upper surface
210 busbar first terminal
212 busbar first exposed part
212a front end
220 busbar second terminal
221 busbar second sheathed part (busbar sheathed part)
221a front end
222 busbar second exposed part
222a front end
223 bent part
223a front end
251 first conductor plate
252 second conductor plate
253 insulating layer

The invention claimed is:

1. A power converter comprising:
a semiconductor device; and
a busbar connected to the semiconductor device,
wherein the semiconductor device includes:
 a sealing body in which a semiconductor element is resin-sealed;
 a first terminal connected to the semiconductor element, the first terminal projecting from the sealing body along a given direction; and
 a second terminal connected to the semiconductor element, the second terminal being adjacent to the first terminal with a space formed between the second terminal and the first terminal and projecting from the sealing body along the given direction in a direction of projection that is the same as a direction of projection of the first terminal, wherein the first terminal has a first exposed part that extends in the given direction and that is exposed outside the sealing body, wherein the second terminal has a sheathed part projecting from the sealing body, the sheathed part extending in the given direction and being sheathed with an insulating material, and a second exposed part projecting from the sheathed part, the second exposed part extending in the given direction and being exposed outside the sealing body, wherein a distance along the given direction from a front end of the sheathed part to the sealing body is longer than a distance along the given direction from a front end of the first exposed part to the sealing body, wherein a busbar includes:
a molded body in which a first conductor plate and a second conductor plate are resin-sealed;
a busbar first terminal connected to the first conductor plate, the busbar first terminal projecting from the molded body along a specific direction; and
a busbar second terminal connected to the second conductor plate, the busbar second terminal being adjacent to the busbar first terminal with a space formed between the busbar second terminal and the busbar first terminal and projecting from the molded body along the specific direction in a direction of projection that is the same as a direction of projection of the busbar first terminal, wherein the busbar first terminal has a busbar first exposed part that extends in the specific direction and that is exposed outside the molded body, wherein the busbar second terminal has a busbar sheathed part projecting from the molded body, the busbar sheathed part extending in the specific direction and being sheathed with a sheathing material with an insulation property, and a busbar second exposed part projecting from the busbar sheathed part, the busbar second exposed part extending in the specific direction and being exposed outside the molded body, and wherein a distance along the specific direction from a front end of the busbar sheathed part to the molded body is longer than a distance along the specific direction from a front end of the busbar first exposed part to the molded body.

2. The power converter according to claim 1,
wherein the semiconductor device and the busbar are set in a position in which:
the given direction and the specific direction are the same direction; and
the first terminal is counter to the busbar second terminal, the second terminal is counter to the busbar first terminal, and a direction of the first terminal and the second terminal is opposite to a direction of the busbar first terminal and the busbar second terminal, and wherein the first exposed part is connected to the busbar second exposed part and the second exposed part is connected to the busbar first exposed part.

3. The power converter according to claim 1,
wherein the semiconductor device and the busbar are set in a position in which:
the given direction and the specific direction are the same direction; and
the first terminal is counter to the busbar first terminal, the second terminal is counter to the busbar second terminal, and a direction of the first terminal and the second terminal is the same as a direction of the busbar first terminal and the busbar second terminal, and wherein the first exposed part is connected to the busbar first exposed part and the second exposed part is connected to the busbar second exposed part.

4. The power converter according to claim 2, wherein in the semiconductor device and the busbar, a sum of the distance along the given direction from the front end of the first exposed part to the sealing body and the distance along the specific direction from the front end of the busbar second exposed part to the molded body is equal to a sum of the distance along the given direction from the front end of the second exposed part to the sealing body and the distance along the specific direction from the front end of the busbar first exposed part to the molded body.

5. The power converter according to claim 3,
wherein the molded body includes:
the first conductor plate and the second conductor plate that are disposed counter to each other across an insulating layer interposed between the first conductor plate and the second conductor plate; and
a main surface extending along the first conductor plate and the second conductor plate, wherein the molded body is set in a position in which a direction along the main surface intersects the given direction and the specific direction, wherein in the busbar first terminal, the busbar first exposed part projects from a side surface of the molded body, the side surface intersecting the direction along the main surface, in such a way as to project beyond the main surface closer to the second conductor plate than to the first conductor plate, wherein in the busbar second terminal, the busbar sheathed part projects from the main surface beyond which the busbar first exposed part projects out, in such a way as to project beyond the front end of the busbar first exposed part in a direction of going away from the main surface, and wherein the busbar second exposed part has a bent part bent in a direction of heading from the front end of the busbar sheathed part toward the side surface along the main surface, and projects from a front end of the bent part in a direction of going away from the front end of the busbar first exposed part.

* * * * *